(12) United States Patent
Enomoto et al.

(10) Patent No.: US 12,610,744 B2
(45) Date of Patent: Apr. 21, 2026

(54) PIEZOELECTRIC DEVICE HAVING AN INSULATING PORTION OVERLAPPING ELECTRODE OPENING

(71) Applicants: DENSO CORPORATION, Kariya-city (JP); TOYOTA JIDOSHA KABUSHIKI KAISHA, Toyota (JP); MIRISE Technologies Corporation, Nisshin (JP); Nisshinbo Micro Devices Inc., Tokyo (JP)

(72) Inventors: Tetsuya Enomoto, Nisshin-city (JP); Takahide Usui, Fujimino-city (JP); Naokatsu Ikegami, Fujimino-city (JP); Shuji Katakami, Fujimino-city (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP); Nisshinbo Micro Devices Inc., Tokyo (JP)

( * ) Notice: Subject to any disclaimer, the term of this patent is extended or adjusted under 35 U.S.C. 154(b) by 849 days.

(21) Appl. No.: 17/972,622

(22) Filed: Oct. 25, 2022

(65) Prior Publication Data

US 2023/0210010 A1 Jun. 29, 2023

(30) Foreign Application Priority Data

Dec. 28, 2021 (JP) ................................. 2021-214371

(51) Int. Cl.
*H10N 30/00* (2023.01)
*B06B 1/06* (2006.01)
*H10N 30/50* (2023.01)

*H10N 30/85* (2023.01)
*H10N 30/87* (2023.01)

(52) U.S. Cl.
CPC ............. *H10N 30/704* (2024.05); *B06B 1/06* (2013.01); *H10N 30/50* (2023.02); *H10N 30/85* (2023.02); *H10N 30/87* (2023.02)

(58) Field of Classification Search
CPC ........ H10N 30/50; H10N 30/85; H10N 30/87; H10N 30/704; B06B 1/06
USPC ........................................................ 310/311
See application file for complete search history.

(56) References Cited

U.S. PATENT DOCUMENTS

| | | | |
|---|---|---|---|
| 7,109,826 | B2 | 9/2006 | Ginsburg et al. |
| 10,566,517 | B1 | 2/2020 | Littrell et al. |
| 2012/0056946 | A1 | 3/2012 | Kojima et al. |
| 2021/0135651 | A1 | 5/2021 | Lee et al. |

*Primary Examiner* — Emily P Pham
*Assistant Examiner* — Monica Mata
(74) *Attorney, Agent, or Firm* — Posz Law Group, PLC

(57) ABSTRACT

A piezoelectric device includes a support member, and a vibrating portion provided on a support surface of the support member. The vibrating portion includes, in addition to a first electrode, a piezoelectric film and a second electrode arranged in a stacking direction, an insulating film configured to increase an electric resistance value between the first and second electrodes. The first electrode is provided on the support surface of the support member, and includes an opening penetrating the first electrode in the stacking direction. The piezoelectric film is provided on the first electrode to extend across the opening. The second electrode is provided on the piezoelectric film. The insulating film is provided at a position between the first electrode and the second electrode, and at least a part of the insulating film overlaps with the opening in the stacking direction.

15 Claims, 13 Drawing Sheets

PIEZOELECTRIC DEVICE HAVING AN INSULATING PORTION OVERLAPPING ELECTRODE OPENING

CROSS REFERENCE TO RELATED APPLICATION

The present application is based on and claims the benefit of priority of Japanese Patent Application No. 2021-214371, filed on Dec. 28, 2021, the disclosure of which is incorporated herein by reference.

TECHNICAL FIELD

The present disclosure generally relates to a piezoelectric device.

BACKGROUND

Conventionally, a piezoelectric device includes a plate-shaped diaphragm that functions as a substrate, a first electrode, a second electrode, and a piezoelectric film provided between the first electrode and the second electrode. In this piezoelectric device, the first electrode fills an inside of a concave portion provided as a recess on a first surface, which serves as one surface among two main surfaces of the substrate, and has an upper surface forming a plane continuous with the first surface of the substrate. Further, the piezoelectric film is formed to extend over the first surface of the substrate and the upper surface of the first electrode as a continuous plane.

SUMMARY

According to an aspect of the present disclosure, a piezoelectric device includes a support member having a support surface, and a vibrating portion stacked on the support surface in a stacking direction. The vibrating portion includes a first electrode, a piezoelectric film and a second electrode that are arranged adjacently in the stacking direction, and an insulating portion configured to increase an electric resistance value between the first electrode and the second electrode. The first electrode may be arranged on the support surface, and may be provided with (i) an opening penetrating through the first electrode in the stacking direction, and (ii) a first electrode surface that is a surface opposite to the support surface. The piezoelectric film may be provided to extend across the opening on the first electrode surface, and may be provided with a piezoelectric film surface that is a surface opposite to the first electrode surface. The second electrode may be provided on the piezoelectric film surface. In addition, the insulating portion may be provided at a position between the first electrode and the second electrode, and at least a part of the insulating portion overlaps with the opening of the first electrode in the stacking direction.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
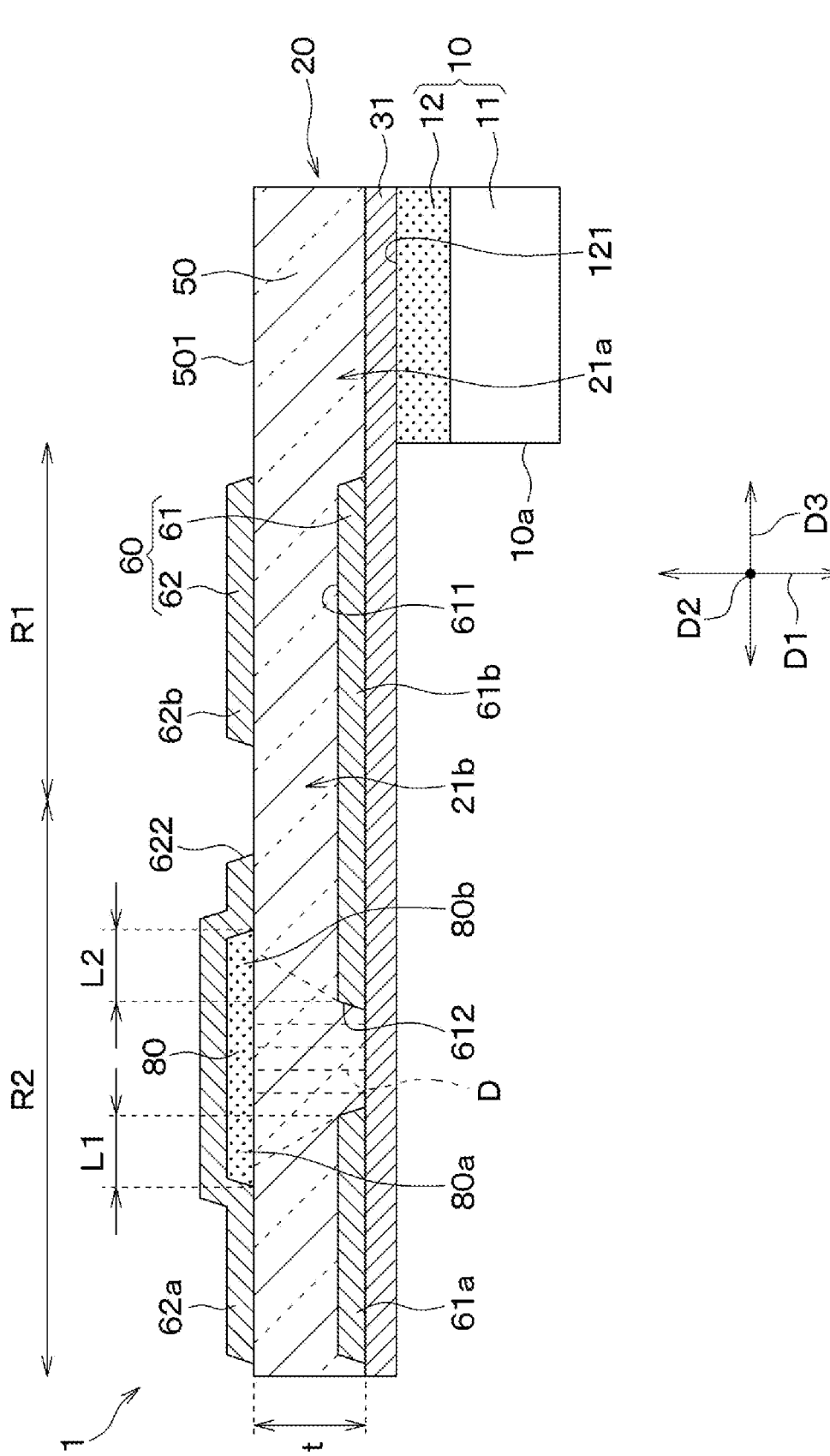
FIG. 1 is a cross-sectional view of a piezoelectric device according to a first embodiment.

In a piezoelectric device, a piezoelectric film may be formed to extend over one surface of a substrate and an upper surface of an electrode as a continuous plane, so that a crystal growth of the piezoelectric film is made stable.

However, according to inventor's diligent study, even if the substrate and the electrode are formed as one continuous planar shape (i.e., as a continuous plane), a small step may still be generated at a connection portion between the substrate and the electrode. Therefore, when the piezoelectric film is formed across the substrate and the electrodes, abnormal crystal particles may be generated at the connection portion of the piezoelectric film between the substrate and the electrode. Further, when the piezoelectric film is formed across a substrate and an electrode made of respectively different materials, a disorder of an orientation/alignment of crystals may be caused in the piezoelectric film at the connection portion between the substrate and the electrode.

The abnormal crystal particles and the disorder of the orientation/alignment of the crystals caused at such connection portion may deteriorate the dielectric loss tangent of the piezoelectric film and become a factor of deteriorating a sensitivity of the piezoelectric device.

It is an object of the present disclosure to provide a piezoelectric device capable of reducing the dielectric loss tangent of a piezoelectric film.

According to an exemplar of the present disclosure, a piezoelectric device includes a support member having a support surface, and a vibrating portion stacked on the support surface in a stacking direction. The vibrating portion includes a first electrode arranged on the support surface of the support member and provided with an opening penetrating through the first electrode in the stacking direction, a piezoelectric film filled in the opening and arranged on a surface of the first electrode in the stacking direction to extend across the opening of the first electrode, a second electrode arranged on the piezoelectric film in the stacking direction, and an insulating portion disposed at a position between the first electrode and the second electrode and configured to increase an electric resistance value between the first electrode and the second electrode. In addition, at least a part of the insulating portion overlaps with the opening of the first electrode in the stacking direction.

According to the above, the electric resistance value between the first electrode and the second electrode is increased by the insulating portion. Therefore, even when a crystallinity abnormality is caused in a portion of the piezoelectric film extending across the opening, deterioration of the dielectric loss tangent of the piezoelectric film can be reduced as compared with a case where the insulating portion is not provided.

For example, the insulating portion may be provided in the piezoelectric film, and may be positioned between the piezoelectric film and the second electrode in the stacking direction.

Alternatively, the piezoelectric film may include a first piezoelectric film and a second piezoelectric film arranged adjacently in the stacking direction. In this case, the first piezoelectric film is arranged on the first electrode and filled in the opening, the insulating portion is provided in the first piezoelectric film to have a same plan surface with a surface of the first piezoelectric film, the insulating portion overlaps with an entire area of the opening in the stacking direction in a cross section taken along the opening in the stacking direction, and the second piezoelectric film is provided on the first piezoelectric film surface and extends across the insulating portion.

Hereinafter, embodiments of the present disclosure will be described with reference to the drawings. In the following embodiments, parts, which are the same as or equivalent to those described in the preceding embodiment(s), are indicated by the same reference signs, and the description thereof may be omitted. Also, in the following embodiments, when only some of the constituent elements are described, corresponding constituent elements of a previously described one or more of the embodiments may be applied to the rest of the constituent elements. The following embodiments may be partially combined with each other even if such a combination is not explicitly described as long as there is no disadvantage with respect to such a combination.

First Embodiment

A piezoelectric device 1 of a first embodiment is described with reference to FIGS. 1 to 4. The piezoelectric device 1 of the present embodiment may be suitable for use as, for example, a microphone.

Figure 2:
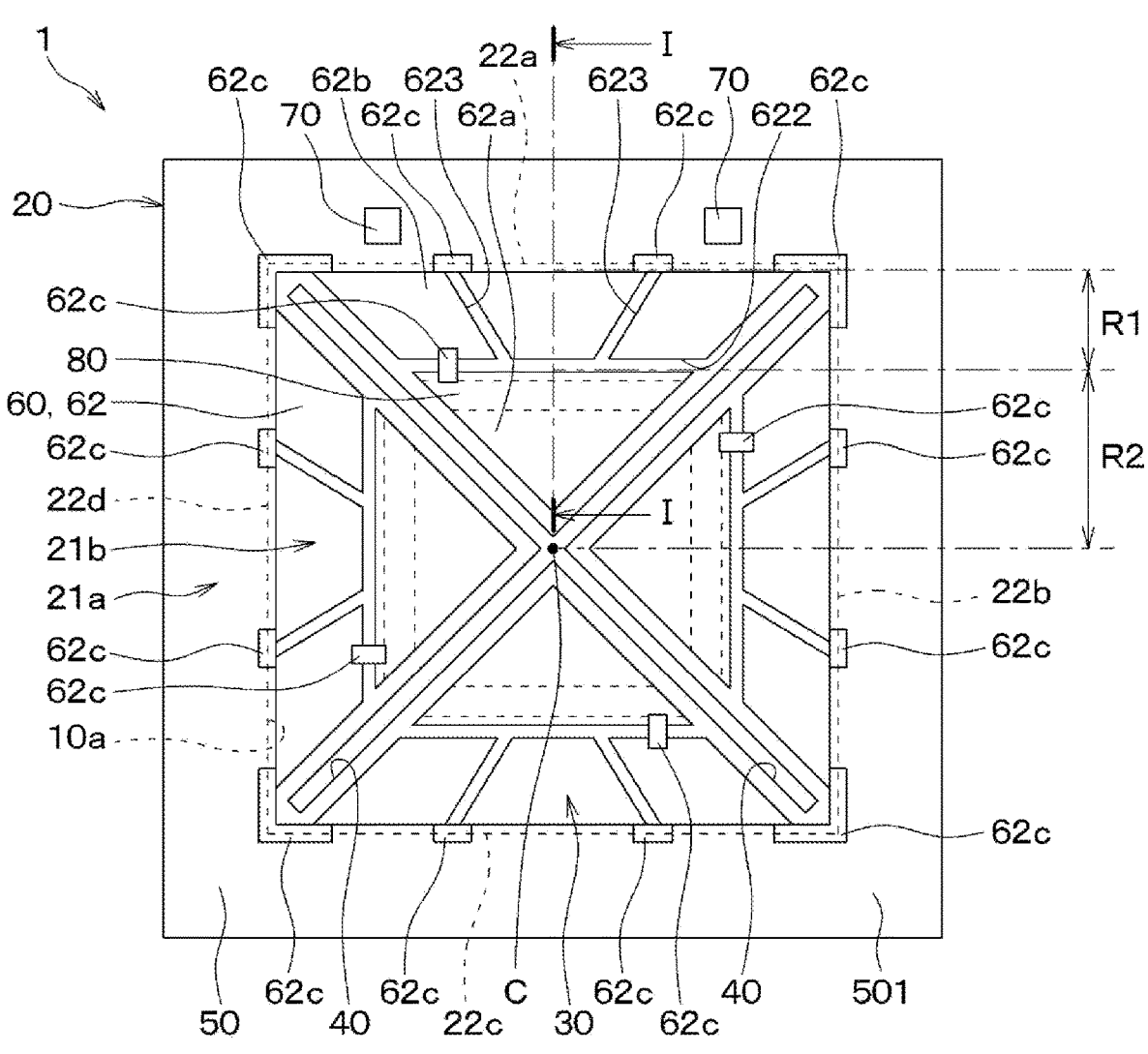
FIG. 2 is a plan view of the piezoelectric device shown in FIG. 1.
Figure 3:
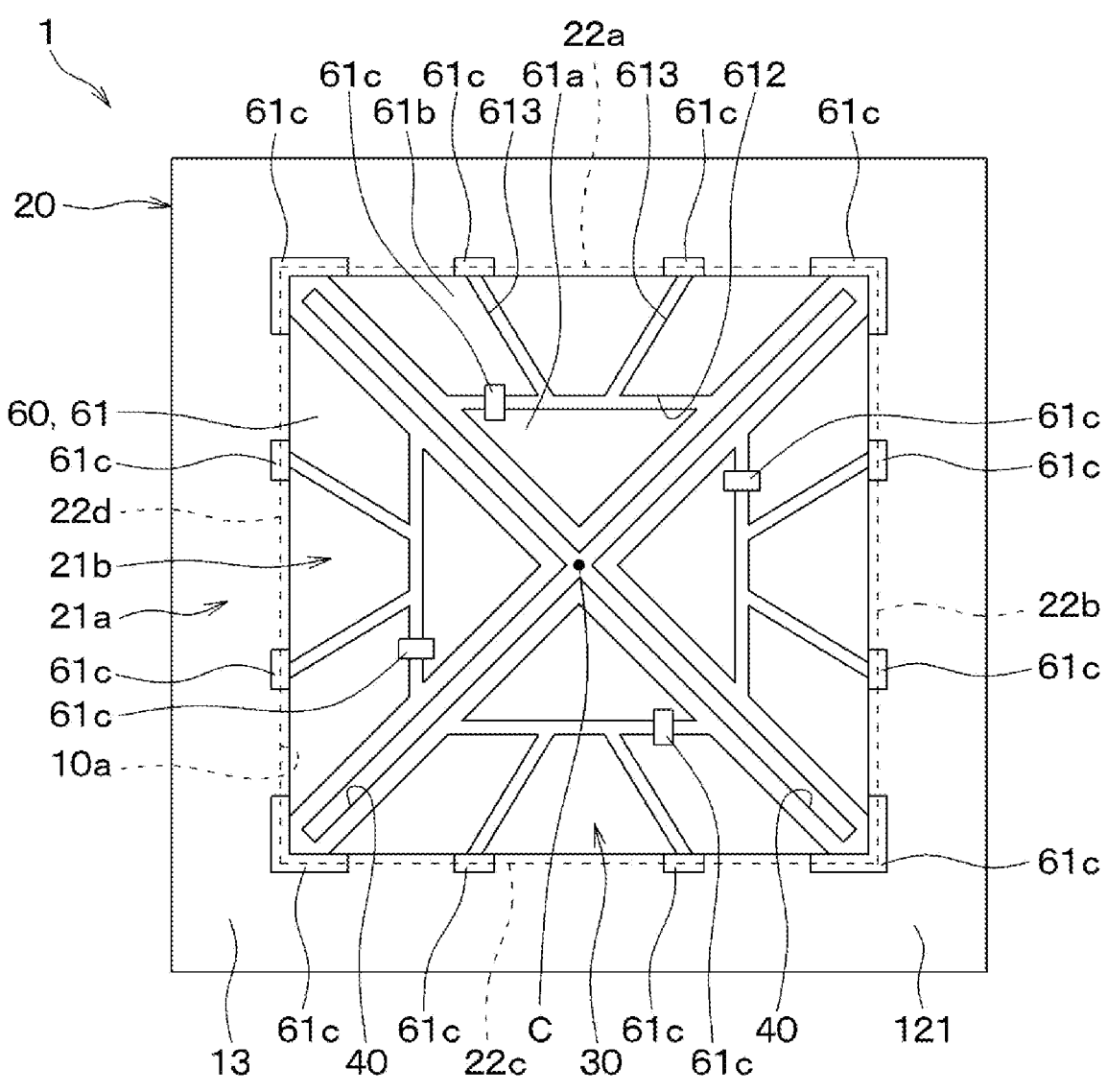
FIG. 3 is a plan view excluding an upper electrode film and a piezoelectric film of the piezoelectric device shown in FIG. 1.

As shown in FIGS. 1 to 3, the piezoelectric device 1 of the present embodiment includes a support member 10 and a vibrating portion 20 provided on the support member 10. Hereinafter, the direction in which the support member 10 and the vibrating portion 20 are connected is referred to as a stacking direction D1.

The support member 10 has a support substrate 11 and an insulating layer 12 which are arranged and stacked adjacently in the stacking direction D1. The support substrate 11 is made of, for example, a silicon substrate or the like. The insulating layer 12 is formed on the support substrate 11 and is made of, for example, an oxide film or the like. The insulating layer 12 has a support surface 121 on which the vibrating portion 20 is arranged.

The vibrating portion 20 is configured to make a sensing unit 30 that outputs a pressure detection signal corresponding to a pressure such as a sound pressure, and is arranged on the support surface 121. In the support member 10, a recess 10*a* is formed for floating an inner edge side of the vibrating portion 20. Therefore, the vibrating portion 20 is configured to have a support region 21*a* arranged directly on the support surface 121 and a floating region 21*b* connected to the support region 21*a* and floating on the recess 10*a*. A shape of the recess 10*a* at an opening end on a side of the vibrating portion 20 is a substantially rectangular, planar shape. Therefore, the floating region 21*b* has a substantially rectangular, planar shape.

As shown in FIGS. 2 and 3, the floating region 21*b* has a separation slit 40 that penetrates through the floating region 21*b* in the stacking direction D1. The separation slit 40 of the present embodiment divides the floating region 21*b* into four parts. Specifically, two separation slits 40 are formed to pass through a central portion C of the floating region 21*b* and respectively extend toward opposite corners of the floating region 21*b*. In other words, the separation slit 40 extends from each of the four corners of the floating region 21*b* having a substantially rectangular, planar shape toward the central portion C, where, at the center portion, the separation slits 40 intersect with each other.

In such manner, the floating region 21*b* is separated into a first vibrating region 22*a*, a second vibrating region 22*b*, a third vibrating region 22*c*, a fourth vibrating region 22*d* each of which has a substantially triangular, planar shape. Specifically, the floating region 21*b* is made by four substantially isosceles triangles, i.e., the first vibrating region 22*a* to the fourth vibrating region 22*d* respectively having two equal-length sides extending toward the central portion C of the floating region 21*b* and a base connected to the two sides.

Although not particularly limited, in the present embodiment, a distance between adjacent ones of the first vibrating region 22*a* to the fourth vibrating region 22*d*, that is, a width of the separation slit 40 is about 1 μm or the like. Further, although the separation slit 40 of the present embodiment is formed to terminate in the floating region 21*b*, the separation slit 40 may continuously extend to the support region 21*a*.

Further, each of the first vibrating region 22*a*, the second vibrating region 22*b*, the third vibrating region 22*c* and the fourth vibrating region 22*d* having the above configuration respectively is configured to have a cantilever structure having one fixed end connected to the support region 21*a* and a tip free end opposite to the support region 21*a*. That is, the first vibrating region 22*a*, the second vibrating region 22*b*, the third vibrating region 22*c* and the fourth vibrating region 22*d* are, respectively, in a state of being connected to the support region 21*a* and in a state of being cantilevered at one side. Hereinafter, the fixed end in the first vibrating region 22*a* to the fourth vibrating region 22*d* may also be referred to as a first region R1, and the free end thereof may also be referred to as a second region R2.

The vibrating portion 20 has a seed layer 31 as a seed film, the piezoelectric film 50, and an electrode portion 60 connected to the piezoelectric film 50. The seed layer 31 is formed on the support surface 121 and is made of, for example, thin-film aluminum nitride, that is, AlN or the like.

The electrode portion 60 has a lower layer electrode film 61 and an upper layer electrode film 62. The vibrating portion 20 is in a sandwiched state, i.e., a portion of the vibrating portion 20 positioned as the floating region 21*b* of the piezoelectric film 50 is inserted between the lower layer electrode film 61 and the upper layer electrode film 62. Further, the lower layer electrode film 61 is formed on the support surface 121 via the seed layer 31. The lower layer electrode film 61 has a lower layer electrode surface 611 on one side opposite to the support surface 121.

The upper layer electrode film 62 is formed on the piezoelectric film 50. The piezoelectric film 50 has a piezoelectric film surface 501 on which the upper layer electrode film 62 is provided on one side opposite to the lower layer electrode surface 611. In other words, the upper layer electrode film 62 is formed on the piezoelectric film surface 501.

Further, the vibrating portion 20 has an insulating film 80 that increases an electric resistance value between the lower layer electrode film 61 and the upper layer electrode film 62. The insulating film 80 is provided at a position between the lower layer electrode film 61 and the upper layer electrode film 62. The lower layer electrode film 61 corresponds to a first electrode, the lower layer electrode surface 611 corresponds to a first electrode surface, the upper layer electrode film 62 corresponds to a second electrode, and the insulating film 80 corresponds to an insulating portion.

The lower layer electrode film 61 and the upper layer electrode film 62 are respectively formed as a film by an etching method, and are formed in each of the first vibrating region 22a to the fourth vibrating region 22d. Further, the lower layer electrode film 61 and the upper layer electrode film 62 formed in each of the first vibrating region 22a to the fourth vibrating region 22d respectively have a corresponding shape corresponding to a substantially triangular, planar shape of the first vibrating region 22a to the fourth vibrating region 22d. That is, the lower layer electrode film 61 and the upper layer electrode film 62 are formed in a substantially triangular, planar shape, and a size of the triangular-shaped area is made smaller than a size of the area of the first vibrating region 22a to the fourth vibrating region 22d. Further, at least a part of the lower layer electrode film 61 and a part of the upper layer electrode film 62 overlap with each other in the stacking direction D1. In the present embodiment, the lower layer electrode film 61 and the upper layer electrode film 62 entirely overlap with each other in the stacking direction D1, and outer edges thereof substantially have the same shape.

The lower layer electrode film 61 and the upper layer electrode film 62 of the present embodiment are respectively formed in each of the first region R1 and the second region R2, in the first vibrating region 22a to the fourth vibrating region 22d. Further, the lower layer electrode film 61 and the upper layer electrode film 62 formed in the first region R1 do not extend to the support region 21a. However, the lower layer electrode film 61 and the upper layer electrode film 62 formed in the first region R1 may extend to the support region 21a. The lower layer electrode film 61 and the upper layer electrode film 62 are connected to an electrode portion 70 provided in the support region 21a shown in FIG. 2 via electrical wiring (not shown).

The lower layer electrode film 61 and the upper layer electrode film 62 formed in each of the first vibrating region 22a to the fourth vibrating region 22d respectively have the same basic configuration. Further, the insulating film 80 formed at a position between the lower layer electrode film 61 and the upper layer electrode film 62 of each of the first vibrating region 22a to the fourth vibrating region 22d has the same basic configuration. Therefore, in the following description, the details of the lower layer electrode film 61, the upper layer electrode film 62, and the insulating film 80 formed in the first vibrating region 22a are described, and the details of the lower layer electrode film 61, the upper layer electrode film 62, and the insulating film 80 formed in the second vibrating region 22b to the fourth vibrating region 22d may be omitted the description.

As shown in FIG. 3, the lower layer electrode film 61 of the present embodiment is divided into a plurality of parts. Further, as shown in FIG. 2, the upper layer electrode film 62 is divided into a plurality of parts.

Specifically, as shown in FIG. 3, the lower layer electrode film 61 is divided by a lower layer first slit 612 into two parts, including a lower layer inner electrode film 61a having a substantially isotropic triangular, planar shape and a lower layer outer electrode film 61b having a substantially trapezoidal, planar shape. Further, the lower layer outer electrode film 61b having a substantially trapezoidal, planar shape is divided by two lower layer second slits 613 into respectively different, three substantially trapezoidal, planar shapes. The lower layer first slit 612 and the lower layer second slit 613 are formed to penetrate the lower layer electrode film 61 in the stacking direction D1.

The lower layer first slit 612 is formed to extend along a direction in which the base of the lower layer inner electrode film 61 having a substantially isosceles, triangular and planar shape extends. That is, the lower layer first slit 612 is formed on a plane orthogonal to the stacking direction D1 to extend along a direction orthogonal to the direction from the center of the base of the first vibrating region 22a toward the central portion C. Hereinafter, the direction in which the lower layer first slit 612 in each of the first vibrating region 22a to the fourth vibrating region 22d extends may also be referred to as a slit extending direction D2, and the direction orthogonal to both of the slit extending direction D2 and the stacking direction D1 may also be referred to as a slit width direction D3. The lower layer first slit 612 corresponds to an opening, and the slit width direction D3 corresponds to a cross-sectional width direction.

Further, the two lower layer second slits 613 are respectively formed to extend from each of the two points that divide the base of the lower layer electrode film 61 having a substantially isosceles, triangular, and planar shape into three equal parts toward the substantial center area of the lower layer inner electrode film 61a. The two lower layer second slits 613 formed in such manner do not intersect each other.

As shown in FIG. 2, in each of the first vibrating region 22a to the fourth vibrating region 22d, the upper layer electrode film 62 is divided into two by the upper layer first slit 622, that is, into (i) an upper layer inner electrode film 62a having a substantially isotropic, triangular, and planar shape and (ii) an upper layer outer electrode film 62b having a substantially trapezoidal, planar shape. Further, the upper layer outer electrode film 62b having a substantially trapezoidal, planar shape is divided into respectively different three substantially trapezoidal, planar shapes by the two upper layer second slits 623. The upper layer first slit 622 and the upper layer second slit 623 are formed to penetrate the upper layer electrode film 62 in the stacking direction D1.

The upper layer first slit 622 is formed along the slit extending direction D2. That is, the upper layer first slit 622 is formed along a direction orthogonal to the slit width direction D3 on the plane orthogonal to the stacking direction D1.

Further, as shown in FIG. 1, the upper layer first slit 622 is formed to be shifted in the slit width direction D3 with respect to a formation position of the lower layer first slit 612 so as not to overlap with the lower layer first slit 612 in the stacking direction D1. Specifically, the upper layer first slit 622 is formed at a position closer to the support region 21*a* than the lower layer first slit 612. In other words, the upper layer first slit 622 is formed at a position farther from the central portion C of the floating region 21*b* than the lower layer first slit 612. The upper layer first slit 622 is formed at a position for positioning the upper layer inner electrode film 62*a* in the second region R2 and for positioning the upper layer outer electrode film 62*b* in the first region R1.

Further, the two upper layer second slits 623 are respectively formed to extend from each of the two points that divide the base of the upper layer electrode film 62 having a substantially isosceles, triangular shape, into three equal parts. The two upper layer second slits 623 respectively extend from the base of the upper layer electrode film 62 as toward the substantial center of the upper layer inner electrode film 62*a*, to the position of the upper layer first slit 622. The two upper second slits 623 formed in such manner do not intersect each other. Further, as shown in FIGS. 2 and 3, the two upper layer second slits 623 are provided at positions overlapping with the lower layer second slits 613, respectively, in the stacking direction D1.

In the piezoelectric device 1 with the above structure, the lower layer inner electrode film 61*a* and the upper layer inner electrode film 62*a* face each other via the piezoelectric film 50 in the stacking direction D1 in each of the first vibrating region 22*a* to the fourth vibrating region 22*d*. Further, in the piezoelectric device 1, the three lower layer outer electrode films 61*b* and the three upper layer outer electrode films 62*b* face each other via the piezoelectric film 50 in the stacking direction D1 in each of the first vibrating region 22*a* to the fourth vibrating region 22*d*.

Further, in the piezoelectric device 1, a part of the three lower layer outer electrode films 61*b* and a part of the three upper layer inner electrode films 62*a* face each other via the piezoelectric film 50 in the stacking direction D1 in each of the first vibrating region 22*a* to the fourth vibrating region 22*d*. However, in the piezoelectric device 1, the lower layer inner electrode film 61*a* and the upper layer outer electrode film 62*b* do not face each other in the stacking direction D1 in each of the first vibrating region 22*a* to the fourth vibrating region 22*d*.

In the present embodiment, one end of the lower layer inner electrode film 61*a* on a fixed end side in the slit width direction D3 is positioned closer to the free end than one end of the upper layer inner electrode film 62*a* on the fixed end side in the slit width direction D3. On the other hand, one end of the lower layer outer electrode film 61*b* on a free end side in the slit width direction D3 is positioned closer to the free end than one end of the upper layer outer electrode film 62*b* on the free end side in the slit width direction D3.

The lower layer electrode film 61 formed in each of the first vibrating region 22*a* to the fourth vibrating region 22*d* is electrically connected in series with each other via a lower layer wiring 61*c*. Further, the upper layer electrode films 62 formed in each of the first vibrating region 22*a* to the fourth vibrating region 22*d* is electrically connected in series with each other via an upper layer wiring 62*c*.

In such manner, the floating region 21*b* can be set in a state in which a capacitance is formed between the lower layer electrode film 61 and the upper layer electrode film 62 in each of the first vibrating region 22*a* to the fourth vibrating region 22*d*.

Although not particularly limited, in the present embodiment, the lower layer electrode film 61 and the upper layer electrode film 62 are made of molybdenum. Note that the lower layer electrode film 61 and the upper layer electrode film 62 may be made of a metal material containing any one of titanium, platinum, aluminum, ruthenium, silicon and the like as a main component, in addition to molybdenum. Further, these materials constituting the lower layer electrode film 61 and the upper layer electrode film 62 are materials having a lattice constant closer to the material of the piezoelectric film 50 than the material of the insulating layer 12.

The piezoelectric film 50 is formed on the lower layer electrode surface 611 of the lower layer electrode film 61 on which the lower layer first slit 612 and the lower layer second slit 613 are formed. That is, the piezoelectric film 50 is filled in the lower layer first slit 612 and the lower layer second slit 613, and is formed on the lower layer electrode surface 611 across the lower layer first slit 612 and the lower layer second slit 613.

Although not particularly limited, in the present embodiment, the piezoelectric film 50 is configured to contain scandium. For example, the piezoelectric film 50 is made of scandium nitride, that is, ScAlN.

When the piezoelectric film 50 is made of scandium aluminum nitride, the larger the mass of scandium contained in the unit mass of the piezoelectric film 50, the easier it is to improve the sound pressure detection sensitivity of the piezoelectric device 1. That is, the higher the concentration of scandium in the piezoelectric film 50 made of scandium aluminum nitride, the easier it is to improve the sound pressure detection sensitivity of the piezoelectric device 1. Therefore, in the present embodiment, the piezoelectric film 50 is made of scandium aluminum nitride having a relatively high concentration of scandium.

Further, the sensing unit 30 of the present embodiment is configured to output a change in an electric charge in each of the first vibrating region 22*a* to the fourth vibrating region 22*d* as one pressure detection signal. In the present embodiment, the first vibrating region 22*a* to the fourth vibrating region 22*d* are electrically connected in series.

Subsequently, the insulating film 80 is described. The insulating film 80 of the present embodiment is provided at a position between the lower layer electrode film 61 and the upper layer electrode film 62 in each of the first vibrating region 22*a* to the fourth vibrating region 22*d*, thereby at least a part of the insulating film 80 is positioned to overlap with the lower layer first slit 612 in the stacking direction D1. Specifically, the insulating film 80 is formed to have a substantially planar, thin film shape at a position between the lower layer electrode surface 611 and the upper layer electrode film 62, which is a position away from the lower layer electrode surface 611 in each of the first vibrating region 22*a* to the fourth vibrating region 22*d*. In the present embodiment, the insulating film 80 is provided on the piezoelectric film surface 501 of the piezoelectric film 50 formed on the lower layer electrode surface 611, and is sandwiched between the piezoelectric film 50 and the upper layer electrode film 62.

Further, the insulating film 80 is formed to entirely overlap with the lower layer first slit 612 in the stacking direction D1, i.e., from one end to the other end of the lower layer first slit 612 along the slit extending direction D2. Further, as shown in FIG. 1 showing a cross section when cut in the stacking direction D1, the insulating film 80 overlaps entirely with the lower layer first slit 612 in the stacking direction D1, and is formed across the lower layer first slit 612. In other words, the insulating film 80 covers the entire lower layer first slit 612 in the cross section shown in FIG. 1 when viewed from the stacking direction D1.

Further, the insulating film 80 is formed to have a larger size (i.e., width) in the slit width direction D3 than the size of the lower layer first slit 612 in the slit width direction D3. However, the insulating film 80 may be formed at a position that does not overlap with the upper layer first slit 622 in the stacking direction D1 in the cross section shown in FIG. 1.

For example, the insulating film 80 has, on one side of the slit width direction D3 in the cross section shown in FIG. 1, a first expansion portion 80a that does not overlap with the lower layer first slit 612 in the stacking direction D1. Further, the insulating film 80 has, on the other side of the slit width direction D3 in the cross section shown in FIG. 1, a second expansion portion 80b that does not overlap with the lower layer first slit 612 in the stacking direction D1.

In the first expansion portion 80a, a first expansion width L1, which is the size in the slit width direction D3, is set to be four times or more of a piezoelectric film thickness t, which is a dimension of the piezoelectric film 50 in the stacking direction D1. Further, in the second expansion portion 80b, a second expansion width L2, which is the size in the slit width direction D3, is set to be four times or more of the piezoelectric film thickness t. Note that, in FIG. 1, in order to make the piezoelectric film 50 easier to see, the dimension of the piezoelectric film 50 in the stacking direction D1 is expanded (i.e., exaggerated) as compared with the dimension of the first expansion portion 80a and the second expansion portion 80b in the stacking direction D1.

Further, the insulating film 80 is made of a material having a larger electric resistance value than the piezoelectric film 50 and a smaller dielectric constant than the piezoelectric film 50, i.e., made of a different material that makes the support member 10. For example, the insulating film 80 is configured to include an amorphous film having a relatively low defect density or no defects due to solidification of atoms in an amorphous state, i.e., of irregularly arranged atoms. Specifically, the insulating film 80 is made of silicon nitride, that is, SiN, aluminum oxide, that is, Al2O3, aluminum nitride, that is, AlN, silicon dioxide, that is, SiO2, and the like. The insulating film 80 is formed on the piezoelectric film surface 501 by a sputtering method, a CVD method (i.e., abbreviation of Chemical Vapor Deposition), or the like.

A plurality of insulating films 80 are formed at positions corresponding to each of the lower layer first slits 612 formed in the lower layer electrode film 61, in each of the first vibrating region 22a to the fourth vibrating region 22d. That is, the insulating film 80 formed in each of the first vibrating region 22a to the fourth vibrating region 22d is positioned correspondingly to a portion where the lower layer first slit 612 of each of the first vibrating region 22a to the fourth vibrating region 22d is formed distributedly in an island shape, apart from each other. Further, the upper layer electrode film 62 in each of the first vibrating region 22a to the fourth vibrating region 22d is provided on the piezoelectric film surface 501 across the insulating film 80 provided in each of the first vibrating region 22a to the fourth vibrating region 22d.

In the piezoelectric device 1 having such a configuration, when a sound pressure is applied to the first vibrating region 22a to the fourth vibrating region 22d, which are the sensing unit 30 respectively, the first vibrating region 22a to the fourth vibrating region 22d vibrate. In such case, when a second region R2 side end of each of the first vibrating region 22a to the fourth vibrating region 22d, that is, the free end is displaced upward, a tensile stress is generated in a lower portion of the piezoelectric film 50, and a compressive stress is generated in an upper portion side of the film 50. Therefore, the sound pressure is detected by extracting the electric charge from a position between the lower layer electrode film 61 and the upper layer electrode film 62 provided in each of the first vibrating region 22a to the fourth vibrating region 22d.

Further, the piezoelectric device 1 has a cantilever support structure in which each of the first vibrating region 22a to the fourth vibrating region 22d has one end on a first region R1 side as a fixed end and a tip portion on a second region R2 side as a free end. Therefore, the stress generated in the piezoelectric film 50 provided in each of the first vibrating region 22a to the fourth vibrating region 22d has an improved sound pressure detection sensitivity as compared with a case where the piezoelectric film 50 is not configured with the cantilever support structure.

Further, the lower layer first slit 612 and the upper layer first slit 622 are formed to be displaced from each other in the slit width direction D3 so as not to overlap with each other in the stacking direction D1. Therefore, the rigidity of the sensing unit 30 is unlikely to decrease as compared with a case where the lower layer first slit 612 and the upper layer first slit 622 are formed at positions overlapping with each other in the stacking direction D1. Therefore, when each of the first vibrating region 22a to the fourth vibrating region 22d is displaced, the sensing unit 30 is less likely to be damaged or broken.

The piezoelectric film 50 of the present embodiment is made of scandium aluminum nitride. Further, the piezoelectric film 50 is formed to extend across the lower layer first slit 612 on the lower layer electrode surface 611 of the lower layer electrode film 61 formed by etching with molybdenum. Therefore, when the piezoelectric film 50 made of a material different from the lower layer electrode film 61 is formed on the lower layer electrode surface 611, the growth of crystal of the piezoelectric film 50 may be hard to be stable in a portion extending across the lower layer first slit 612. Therefore, in the piezoelectric film 50, abnormal crystal particles may be generated in a portion extending across the lower layer first slit 612, and an abnormal crystalline portion D may be generated.

The abnormal crystalline portion D caused by the generation of the abnormal crystal particles is generated scatteringly away from a center of the lower layer first slit 612 with reference to an edge of the lower layer first slit 612, as a separation distance from the lower layer first slit 612 in the stacking direction D1 increases. In other words, the abnormal crystalline portion D extends radially from the portion of the lower layer electrode surface 611 where the lower layer first slit 612 is formed toward the upper layer electrode film 62. A broken line shown in FIG. 1 indicates the abnormal crystalline portion D generated in the piezoelectric film 50.

The generation of such an abnormal crystalline portion D reduces the electric resistance value between the lower layer electrode film 61 and the upper layer electrode film 62, and provides a cause of a leak current to flow between the lower layer electrode film 61 and the upper layer electrode film 62. When a leak current flows between the lower layer electrode film 61 and the upper layer electrode film 62, the dielectric loss tangent of the piezoelectric device 1, that is, the dielectric loss deteriorates, thereby causing the sound pressure detection sensitivity of the piezoelectric device 1 to deteriorate. Further, since the piezoelectric film 50 of the present embodiment is made of scandium aluminum nitride, when scandium aluminum nitride is formed on the lower layer electrode surface 611 made of molybdenum, the higher the concentration of scandium becomes, the more the abnormal crystalline portion D is likely to occur.

The dielectric loss tangent tan δ of the piezoelectric device 1 is represented by the following equation 1.

$$\tan \delta = 1/\omega \times Rp \times Cp \qquad \text{(Equation 1)}$$

In Equation 1, ω indicates an angular frequency of the electric field generated between the lower layer electrode film 61 and the upper layer electrode film 62. Further, Rp indicates an electric resistance value of the piezoelectric device 1. Further, Cp indicates a capacitance of the piezoelectric device 1. Further, the dielectric loss tangent tan δ of the piezoelectric device 1 represented by the Equation 1 becomes smaller as the electric resistance value Rp of the piezoelectric device 1, that is, the electric resistance value between the lower layer electrode film 61 and the upper layer electrode film 62, becomes larger.

On the other hand, in the present embodiment, the insulating film 80 that increases the electric resistance value between the lower layer electrode film 61 and the upper layer electrode film 62 is provided at a position between the lower layer electrode surface 611 and the upper layer electrode film 62, which is a position that overlaps with the lower layer first slit 612 in the stacking direction D1.

According to the above, the insulating film 80 can increase the electric resistance value between the lower layer electrode film 61 and the upper layer electrode film 62 in the portion of the piezoelectric film 50 overlapping with the lower layer first slit 612 in the stacking direction D1. Therefore, even when the abnormal crystalline portion D is generated in the portion of the piezoelectric film 50 extending across the lower layer first slit 612, deterioration of the dielectric loss tangent tan δ of the piezoelectric film 50 can be reduced. Therefore, the sound pressure detection sensitivity of the piezoelectric device 1 is improvable as compared with a case where the insulating film 80 is not provided.

In particular, the piezoelectric device 1 of the present embodiment has a configuration in which an abnormal crystalline portion D is likely to occur because the piezoelectric film 50 is made of scandium aluminum nitride having a relatively high concentration of scandium. However, by providing the insulating film 80 between the lower layer electrode film 61 and the upper layer electrode film 62, deterioration of the dielectric loss tangent tan δ of the piezoelectric film 50 can be effectively reduced. Therefore, while improving the sound pressure detection sensitivity of the piezoelectric device 1 by having a relatively high concentration of scandium, the decrease in the sound pressure detection sensitivity of the piezoelectric device 1 due to the relatively high concentration of scandium is suppressed.

Further, according to the embodiment described above, the following advantageous effects are achievable.

(1) In the above embodiment, the insulating film 80 is provided on the piezoelectric film surface 501. The upper layer electrode film 62 is provided on the piezoelectric film surface 501 to extend across the insulating film 80.

According to the above, the insulating film 80 is easily arranged on the piezoelectric device 1 as compared with a configuration in which the insulating film 80 is formed inside the piezoelectric film 50.

(2) In the above embodiment, the insulating film 80 has a first expansion portion 80a that does not overlap with the lower layer first slit 612 in the stacking direction D1 on one side thereof in the slit width direction D3 that is orthogonal to the stacking direction D1 in the cross section shown in FIG. 1. Further, the insulating film 80 has a second expansion portion 80b on the other side thereof in the slit width direction D3, which does not overlap with the lower layer first slit 612 in the stacking direction D1. Then, the first expansion portion 80a and the second expansion portion 80b are formed so that each size (i.e., the width) of the first expansion portion 80a and the second expansion portion 80b in the slit width direction D3 is four times or more of the dimension (i.e., the thickness) of the piezoelectric film 50 in the stacking direction D1 in which the insulating film 80 is provided on the piezoelectric film 50.

By the way, the abnormal crystalline portion D caused by the abnormal particles of the crystal in the piezoelectric film 50 is generated scatteringly away from a center of the lower layer first slit 612 with reference to an edge of the lower layer first slit 612, as a separation distance from the lower layer first slit 612 in the stacking direction D1 increases. Therefore, the abnormal crystalline portion D generated in the piezoelectric film 50 has a greater cross-sectional area size in the cross section orthogonal to the stacking direction D1 as a position of the abnormal crystalline portion D approaches the upper layer electrode film 62.

Then, when the abnormal crystalline portion D reaches the upper layer electrode film 62 from the lower layer first slit 612, the cross-sectional area size of the abnormal crystalline portion D orthogonal to the stacking direction D1 becomes maximum. According to the applicant's diligent study, a distance in the slit width direction D3 from the edge of the lower layer first slit 612 to the end of the abnormal crystalline portion D when the abnormal crystalline portion D reaches the upper layer electrode film 62 is found as about four times of the piezoelectric film thickness t.

Further, in the piezoelectric film 50 in which the abnormal crystalline portion D is generated diffusingly toward the upper layer electrode film 62 in such manner, it is found that the larger a coverage of the insulating film 80 covering a generation portion of the abnormal crystalline portion D is made, the greater the electric resistance value between the lower layer electrode film 61 and the upper layer electrode film 62 becomes.

Figure 4:
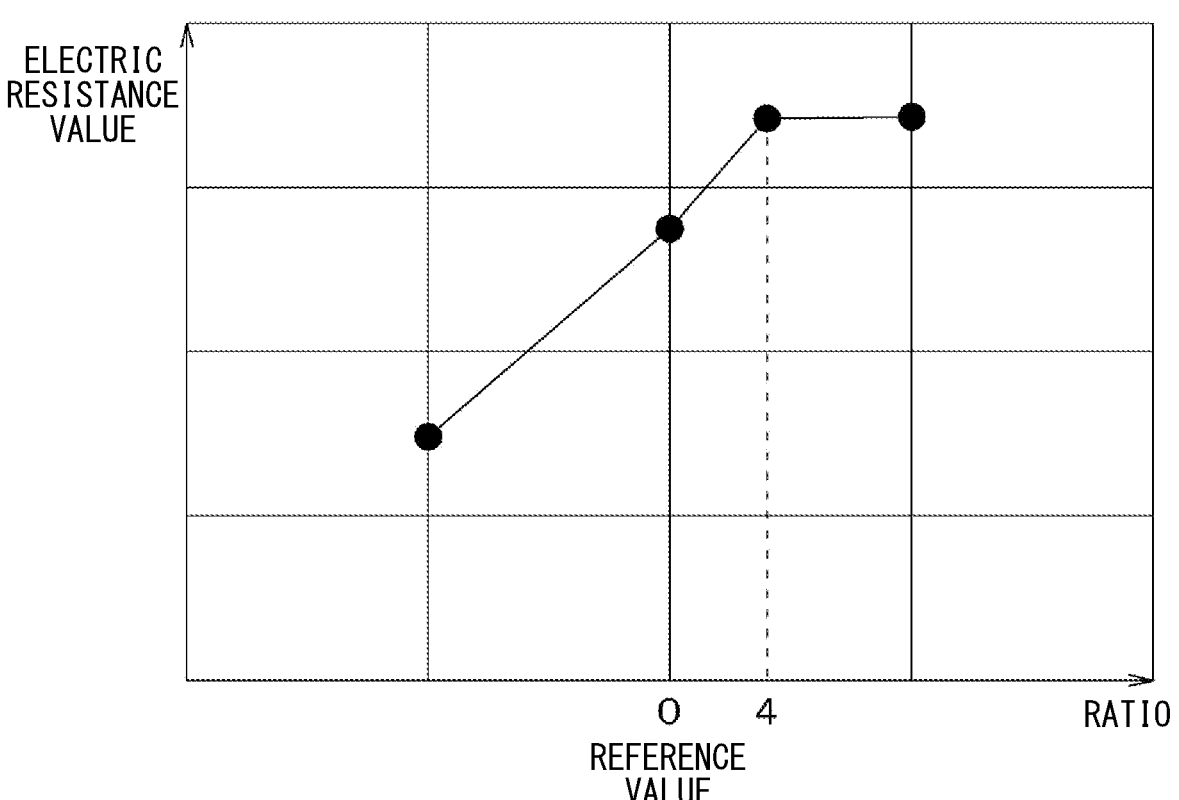
FIG. 4 is a diagram showing a relationship between a size of an insulating film and an electric resistance value.

FIG. 4 shows an experimental result of measuring the electric resistance value between the lower layer electrode film 61 and the upper layer electrode film 62 when changing the size of the cross-sectional area orthogonal to the stacking direction D1 of the insulating film 80, in case that the insulating film 80 is provided on the piezoelectric film surface 501.

In such experiment, a case where the size of the lower layer first slit 612 in the slit width direction D3 is set to be equal to the size of the insulating film 80 in the slit width direction D3 is used as a reference value. Then, a change in the electric resistance value between the lower layer electrode film 61 and the upper layer electrode film 62 is measured when the size of the insulating film 80 in the slit width direction D3 is changed with respect to the size of the lower layer first slit 612 in the slit width direction D3.

As shown in FIG. 4, when the size of the insulating film 80 in the slit width direction D3 is smaller than the size of the lower layer first slit 612 in the slit width direction D3, the electric resistance value between the lower layer electrode film 61 and the upper layer electrode film 62 becomes smaller than the reference value. Further, when the size of the insulating film 80 in the slit width direction D3 is greater than the size of the lower layer first slit 612 in the slit width direction D3, the electric resistance value between the lower layer electrode film 61 and the upper layer electrode film 62 becomes greater than the reference value. That is, when the insulating film 80 is configured to have the first expansion portion 80a and the second expansion portion 80b that do not respectively overlap with the lower layer first slit 612 in the stacking direction D1 as in the present embodiment, the electric resistance value between the lower layer electrode film 61 and the upper layer electrode film 62 can be made greater than the reference value.

Further, when the first expansion width L1 and the second expansion width L2 are set to four times of the dimension of the piezoelectric film 50 in the stacking direction D1, that is, the piezoelectric film thickness t, the electric resistance value between the lower layer electrode film 61 and the upper layer electrode film 62 substantially becomes the maximum value. In other words, when the insulating film 80 having the first expansion portion 80a and the second expansion portion 80b covers the entire formation range of the abnormal crystalline portion D on the piezoelectric film surface 501, the electric resistance value Rp of the piezoelectric device 1 is substantially maximized.

Note that, when the first expansion width L1 and the second expansion width L2 are set to be greater than four times of the piezoelectric film thickness t, the electric resistance value between the lower layer electrode film 61 and the upper layer electrode film 62 is substantially kept constant. Therefore, the first expansion portion 80a and the second expansion portion 80b are formed so that the size of each of the first expansion portion 80a and the second expansion portion 80b in the slit width direction D3 is four times or more of the size of the piezoelectric film 50 in the stacking direction D1 on which the insulating film 80 is provided. Further, in the present embodiment, the size of the first expansion portion 80a and the second expansion portion 80b in the slit width direction D3 is not made greater than required. The size of the first expansion portion 80a and the second expansion portion 80b in the slit width direction D3 is made to be equal to or less than 100 times of the dimension of the piezoelectric film 50 in the stacking direction D1, on which the insulating film 80 is provided.

Therefore, according to the present embodiment, as compared with a case where the first expansion width L1 and the second expansion width L2 are set to be smaller than four times of the piezoelectric film thickness t, the deterioration of the dielectric loss tangent tan δ caused by the abnormal crystalline portion D of the piezoelectric film 50 is further reducible. Further, by not increasing the size of the first expansion portion 80a and the second expansion portion 80b in the slit width direction D3 than required, the effective range of the electrodes of both of the lower layer electrode film 61 and the upper layer electrode film 62 can be set.

(3) In the above embodiment, the insulating film 80 is made of a material different from that of the support member 10, and is formed at a position corresponding to a portion where the lower layer first slit 612 is formed.

Since the piezoelectric device 1 may possibly be deformed due to a change in external temperature, the piezoelectric device 1 may possibly warp in the stacking direction D1 due to a difference in thermal expansion coefficients of the support member 10 and the insulating film 80 which are made of respectively different materials. In the present embodiment, by specifically forming the insulating film 80 only in the portion corresponding to the lower layer first slit 612, the warpage of the piezoelectric device 1, when the piezoelectric device 1 is deformed due to a change in the external temperature, can be reduced as compared with a case where the insulating film 80 is formed on the entire surface the piezoelectric film surface 501. Therefore, according to the above configuration of the piezoelectric device 1 of the present embodiment, the variation in the sound pressure detection result due to the change in the external temperature can be reduced, thereby increasing the sound pressure detection sensitivity of the piezoelectric device 1.

(4) In the above embodiment, the insulating film 80 is configured to include an amorphous film having an amorphous structure.

According to the above, as compared with a case where the insulating film 80 does not include the amorphous film, the abnormal crystalline portion D generated in the portion of the piezoelectric film 50 extending across the lower layer first slit 612 is less likely to be transmitted in the stacking direction D1. Therefore, the deterioration of the dielectric loss tangent tan δ of the piezoelectric film 50 due to the abnormal crystalline portion D generated in the portion of the piezoelectric film 50 extending across the lower layer first slit 612 is further reducible.

In order to manufacture the piezoelectric device 1 of the present embodiment, first, the support member 10 in which the insulating layer 12 is arranged on the support substrate 11 is prepared, and the seed layer 31, the lower layer electrode film 61 and the piezoelectric film 50 are formed in this order on the support member 10. The lower layer electrode film 61 is made of molybdenum. The piezoelectric film 50 is made of scandium aluminum nitride having a relatively high concentration of scandium.

Then, the insulating film 80 is formed by patterning on the piezoelectric film surface 501 of the piezoelectric film 50 at a position overlapping with the lower layer first slit 612 in the stacking direction D1, and the upper layer electrode film 62 is formed on the piezoelectric film surface 501 to extend across the insulating film 80. The insulating film 80 is made of silicon nitride, aluminum oxide, aluminum nitride, and silicon dioxide. The upper layer electrode film 62 is made of molybdenum. The lower layer electrode film 61 and the upper layer electrode film 62 are formed by a general etching method or the like. Further, the piezoelectric film 50 and the insulating film 80 are formed by a general sputtering method, a CVD method, or the like. In such manner, the above-mentioned piezoelectric device 1 in which the vibrating portion 20 is arranged on the support member 10 is manufactured.

Modification of the First Embodiment

In the above-described first embodiment, an example is shown, in which the insulating film 80 is made of silicon nitride, aluminum oxide, aluminum nitride, silicon dioxide, or the like. However, configuration of the present disclosure is not limited thereto. For example, the insulating film 80 may be formed by layering any two or more materials from among silicon nitride, aluminum oxide, aluminum nitride, and silicon dioxide.

Second Embodiment

Next, a second embodiment is described with reference to FIG. 5. In the present embodiment, the configuration of a piezoelectric film 50 and the forming position of an insulating film 80 are different from those of the above-described first embodiment. The other configurations are the same as those of the first embodiment. Therefore, in the present embodiment, the parts different from the first embodiment are mainly described, and description of the same parts as the first embodiment may be omitted.

The piezoelectric film 50 of the present embodiment is divided into a lower layer piezoelectric film 51 provided on the lower layer electrode surface 611 and an upper layer piezoelectric film 52 layered on the lower layer piezoelectric film 51. That is, the piezoelectric film 50 has a lower layer piezoelectric film 51 and an upper layer piezoelectric film 52 adjacently formed in the stacking direction D1. In other words, the lower layer piezoelectric film 51 and the upper layer piezoelectric film 52 in the vibrating portion 20 are inserted between the lower layer electrode film 61 and the upper layer electrode film 62 in the stacking direction D1.

Further, the sensing unit 30 of the present embodiment has a bimorph structure in the first vibrating region 22a to the fourth vibrating region 22d, in which the lower layer piezoelectric film 51 and the upper layer piezoelectric film 52 are respectively formed in each of the first vibrating region 22a to the fourth vibrating region 22d. The lower layer piezoelectric film 51 and the upper layer piezoelectric film 52 respectively formed in each of the first vibrating region 22a to the fourth vibrating region 22d have substantially the same dimensions in the stacking direction D1. Further, the thickness dimension of each of the lower layer piezoelectric film 51 and the upper layer piezoelectric film 52 in the stacking direction D1 is substantially half of the dimension of the piezoelectric film 50 in the stacking direction D1 of the first embodiment.

Further, each of the lower layer piezoelectric films 51 formed in the first vibrating region 22a to the fourth vibrating region 22d has a lower layer piezoelectric film surface 511 on one side opposite to the lower layer electrode surface 611. Each of the upper layer piezoelectric films 52 formed in the first vibrating region 22a to the fourth vibrating region 22d has an upper layer piezoelectric film surface 521 on one side opposite to the lower layer piezoelectric film surface 511. The lower layer piezoelectric film 51 of the present embodiment corresponds to a first piezoelectric film, the lower layer piezoelectric film surface 511 corresponds to a first piezoelectric film surface, and the upper layer piezoelectric film 52 corresponds to a second piezoelectric film.

The insulating film 80 of the present embodiment is provided at a position between the lower layer electrode film 61 and the upper layer electrode film 62 in each of the first vibrating region 22a to the fourth vibrating region 22d, and is positioned to overlap with the lower layer first slit 612 in the stacking direction D1. Specifically, the insulating film 80 is formed on the lower layer piezoelectric film surface 511, which is formed in each of the first vibrating region 22a to the fourth vibrating region 22d, and has a substantially planar, thin film shape at a position away from, and above, the lower layer electrode surface 611. Further, the insulating film 80 is configured to include an amorphous film as in the first embodiment.

Figure 5:
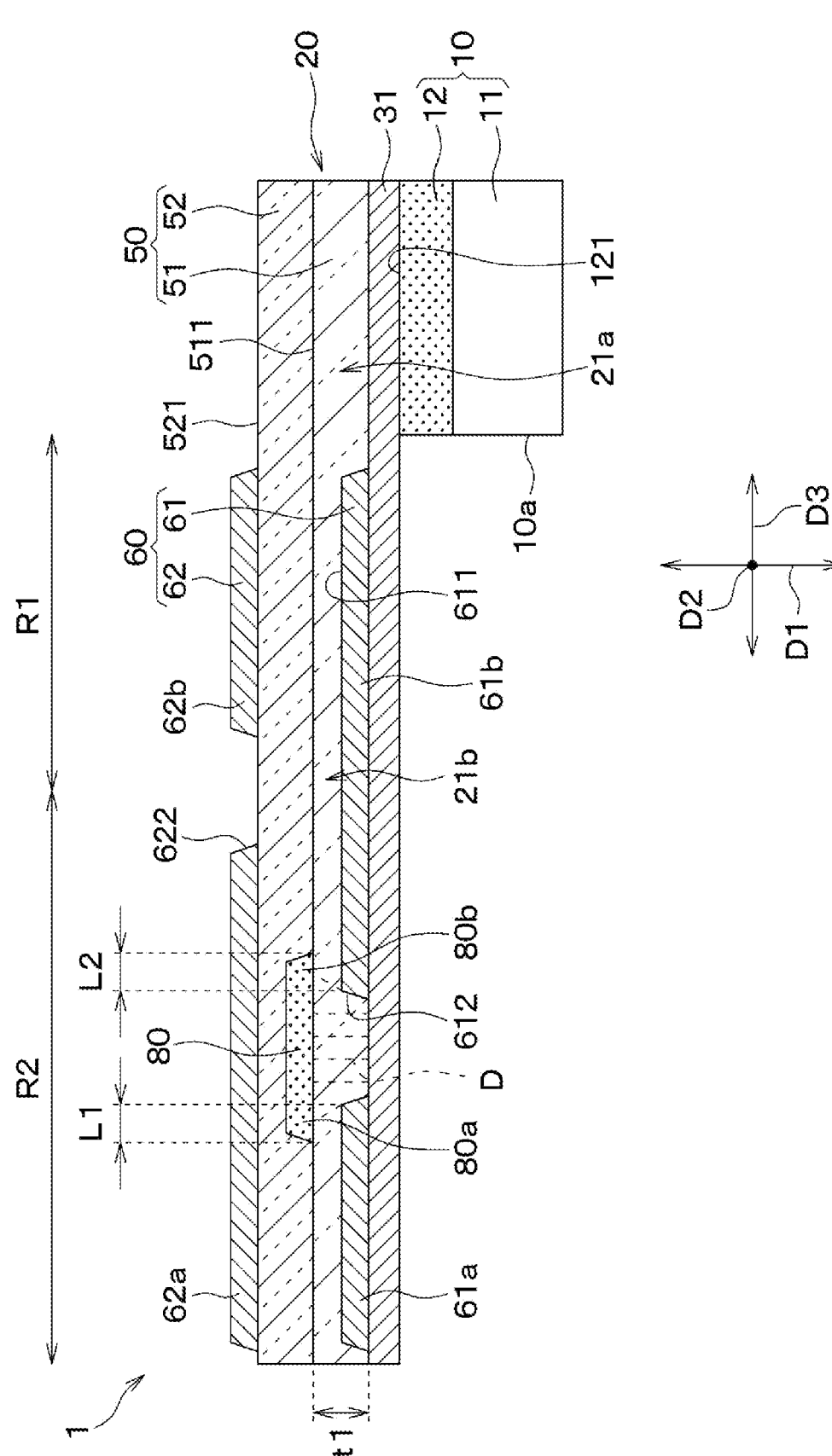
FIG. 5 is a diagram of a piezoelectric device corresponding to FIG. 1 according to a second embodiment.

As shown in FIG. 5, the insulating film 80 overlaps entirely with the lower layer first slit 612 in the stacking direction D1 in the cross section when cut in the stacking direction D1, and is formed to extend across the lower layer first slit 612. Further, the insulating film 80 has the first expansion portion 80a and the second expansion portion 80b as shown in the cross section shown in FIG. 5.

The first expansion portion 80a is formed so that the first expansion width L1 is four times or more of the first piezoelectric film thickness t1 which is the dimension of the lower layer piezoelectric film 51 in the stacking direction D1. Further, the second expansion portion 80b is formed so that the second expansion width L2 is four times or more of the first piezoelectric film thickness t1. However, the first expansion width L1 and the second expansion width L2 in the insulating film 80 of the present embodiment are configured to be smaller than the first expansion width L1 and the second expansion width L2 in the insulating film 80 of the above-described first embodiment.

Further, the lower layer piezoelectric film 51 and the upper layer piezoelectric film 52 are made of scandium aluminum nitride as in the first embodiment. The lower layer piezoelectric film 51 and the upper layer piezoelectric film 52 have substantially the same mass of scandium per unit mass. That is, the lower layer piezoelectric film 51 and the upper layer piezoelectric film 52 made of scandium aluminum nitride have substantially the same concentration of scandium.

Further, the upper layer piezoelectric film 52 of each of the first vibrating region 22a to the fourth vibrating region 22d is provided on the lower layer piezoelectric film surface 511 to extend across the insulating film 80 provided in each of the first vibrating region 22a to the fourth vibrating region 22d. Further, the upper layer electrode film 62 of each of the first vibrating region 22a to the fourth vibrating region 22d is formed on the upper layer piezoelectric film surface 521.

As described above, in the piezoelectric device 1 of the present embodiment, the insulating film 80 is provided on the lower layer piezoelectric film surface 511, extends all the lower layer first slit 612, and overlaps entirely with the lower layer first slit 612 in the stacking direction D1 in the cross section shown in FIG. 5 which is a section cut in the stacking direction D1. The upper layer piezoelectric film 52 is provided on the lower layer piezoelectric film surface 511 to extend across the insulating film 80.

According to the above, the insulating film 80 is brought closer to the lower layer first slit 612 by forming the insulating film 80 on the lower layer piezoelectric film surface 511 of the lower layer piezoelectric film 51, as compared with the configuration in which the insulating film 80 is formed on the upper layer piezoelectric film surface 521.

As described in the first embodiment, the abnormal crystalline portion D generated in the portion extending across the lower layer first slit 612 is radially diffused as the abnormal crystalline portion D, as being separated from the lower layer first slit 612 in the stacking direction D1 with reference to an edge of the lower layer first slit 612. Then, the size of the cross-sectional area of the abnormal crystalline portion D orthogonal to the stacking direction D1 increases as the distance from the lower layer first slit 612 increases.

Therefore, when the insulating film 80 is formed to cover the entire diffusion range of the abnormal crystalline portion D generated by diffusion, the insulating film 80 needs to be arranged such that as the position of the insulating film 80 is arranged farther away from the lower layer first slit 612, the size of insulating film 80 in the slit width direction D3 becomes larger.

In the present embodiment, the insulating film 80 is positioned closer to the lower layer first slit 612 by forming the insulating film 80 on the lower layer piezoelectric film surface 511, as compared with the case where the insulating film 80 is formed on the upper layer piezoelectric film surface 521. According to the above, when the insulating film 80 is formed to overlap with the entire lower layer first slit 612 in the stacking direction D1, the cross sectional area size of the insulating film 80 orthogonal to the stacking direction D1 can be reduced, as compared with the case where the insulating film 80 is formed on the upper layer piezoelectric film surface 521.

Therefore, in the range where the lower layer electrode film 61 and the upper layer electrode film 62 face each other, a portion that does not sandwich the insulating film 80 is increased. That is, the effective range of the electrodes of the lower layer electrode film 61 and the upper layer electrode film 62 is expandable.

Further, by forming the insulating film 80 on the lower layer piezoelectric film surface 511, when the abnormal crystalline portion D is generated from the lower layer electrode film 61 toward the upper layer electrode film 62, the abnormal crystalline portion D is less likely to be generated in the portion where the upper layer piezoelectric film 52 is provided to extend across the insulating film 80. That is, even when the abnormal crystalline portion D is generated in the lower layer piezoelectric film 51, it becomes difficult for the leak current to flow from the lower layer electrode film 61 to the upper layer electrode film 62. Therefore, the capacitance between the lower layer electrode film 61 and the upper layer electrode film 62 is securable while reducing the deterioration of the dielectric loss tangent tan δ caused by the abnormal crystalline portion D of the lower layer piezoelectric film 51.

In order to manufacture the piezoelectric device 1 of the present embodiment, the lower layer piezoelectric film 51, the insulating film 80, and the upper layer piezoelectric film 52 are formed on the lower layer electrode film 61 in this order, thereby enabling the above configuration in which the vibrating portion 20 is arranged on the support member 10.

First Modification of the Second Embodiment

Figure 6:
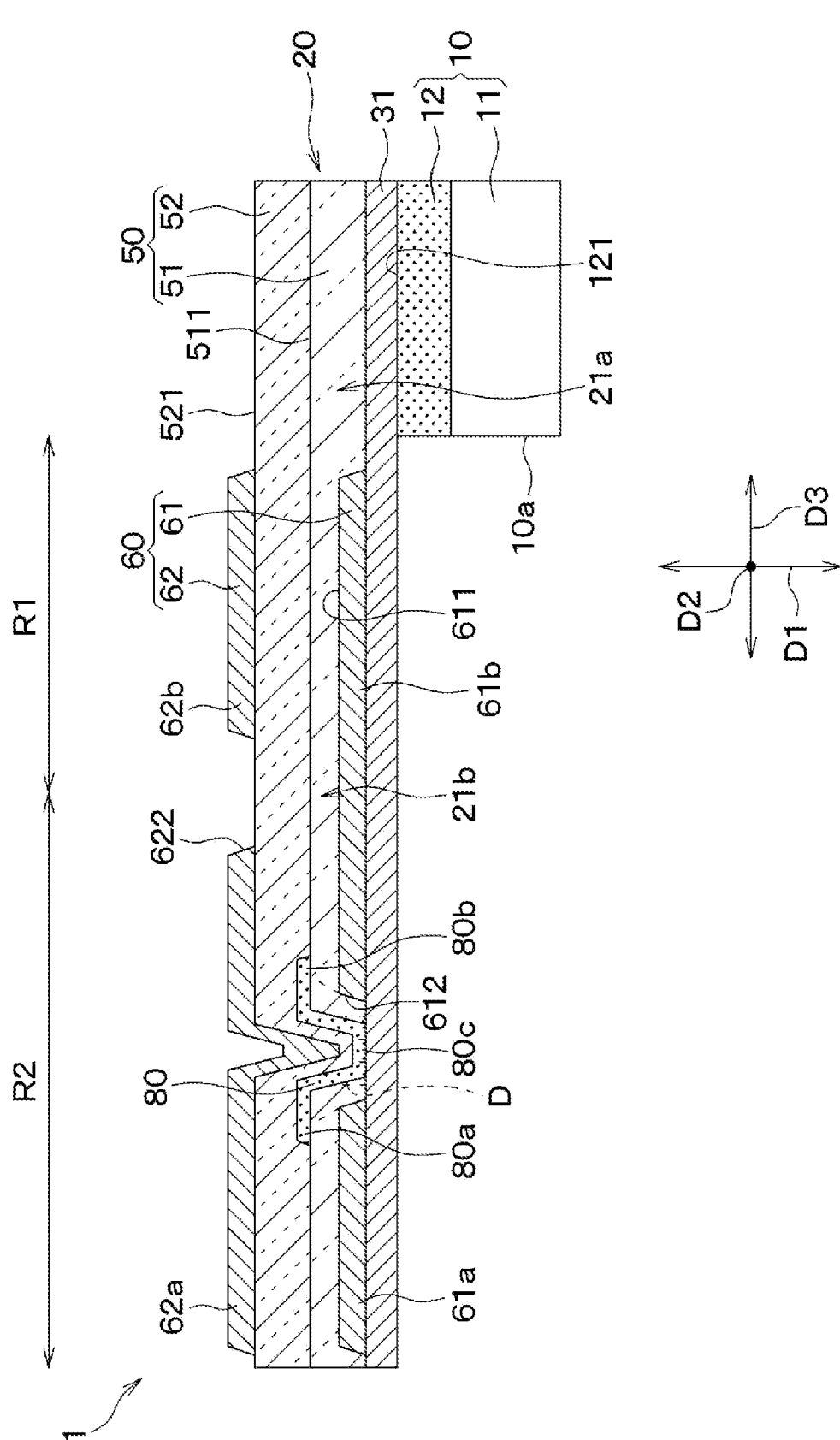
FIG. 6 is a diagram of a piezoelectric device corresponding to FIG. 1 according to a first modification of the second embodiment.

In the second embodiment described above, an example in which the insulating film 80 is formed in a substantially planar, thin film shape has been described. However, the present disclosure is not limited thereto. For example, as shown in FIG. 6, an insulating film 80 may be configured to have an insulating recess 80c recessed toward the lower layer first slit 612. That is, the insulating film 80 may be formed in a wedge shape.

According to the above, the electric resistance value in a direction orthogonal to the stacking direction D1 is increased by the insulating recess 80c in the portion where the abnormal crystalline portion D is generated in the lower layer piezoelectric film 51, thereby the leak current flowing in the plane direction can be reduced.

Second Modification of the Second Embodiment

In the second embodiment described above, an example in which the insulating film 80 is configured to include an amorphous film has been described. However, the present disclosure is not limited thereto. For example, the insulating film 80 may be configured to include a material in which the crystal structure of the upper layer piezoelectric film 52 can be self-aligned. For example, the insulating film 80 may be made of a material including at least one of silicon nitride, aluminum oxide, silicon dioxide, and tantalum pentoxide.

According to the above, the insulating film 80 can have an increased electric resistance value of the upper layer piezoelectric film 52 as compared with the structure in which the crystal structure of the upper layer piezoelectric film 52 does not include a self-aligned material. Therefore, the deterioration of the dielectric loss tangent tan δ of the piezoelectric film 50 due to the abnormal crystalline portion D generated in the portion of the piezoelectric film 50 formed across the lower layer first slit 612 is further reducible.

Third Modification of the Second Embodiment

Figure 7:
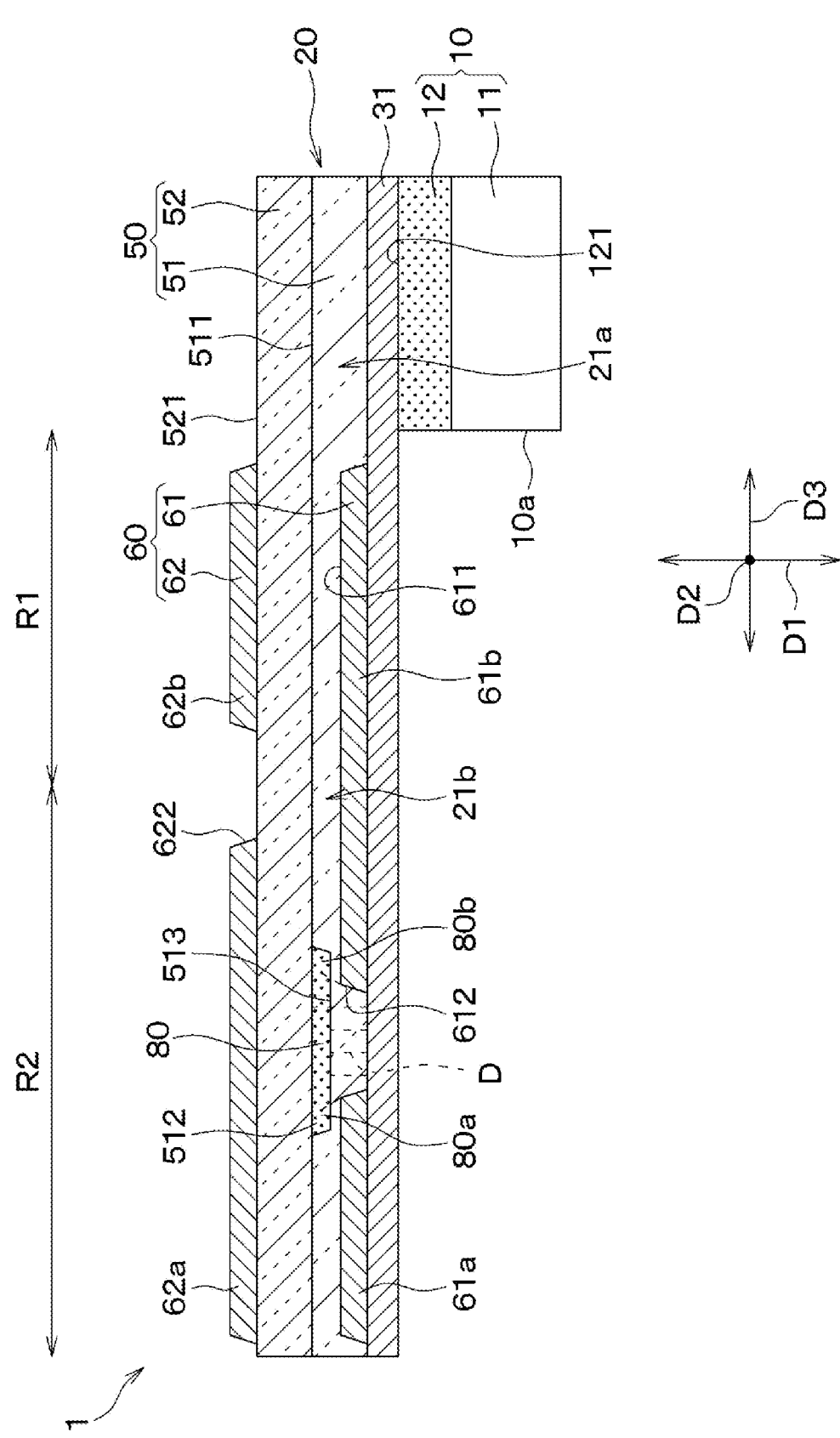
FIG. 7 is a diagram of a piezoelectric device corresponding to FIG. 1 according to a third modification of the second embodiment.

In the second embodiment described above, an example in which the insulating film 80 is formed on the lower layer piezoelectric film surface 511 has been described. However, the present disclosure is not limited thereto. For example, as shown in FIG. 7, the insulating film 80 may fill a piezoelectric film recess 513 recessed toward the lower layer electrode surface 611 from the lower layer piezoelectric film surface 511. In such case, the insulating film 80 may be configured to form a continuous plane with a surface different from the piezoelectric film recess 513 in the lower layer piezoelectric film surface 511. The insulating film 80 may be formed on continuous plane with the surface of the lower layer piezoelectric film surface 511 by a CMP (Chemical Mechanical Polisher) method, an etch back method, or the like.

According to the above, the portion where the upper layer piezoelectric film 52 is formed is made as a continuous planar shape. Therefore, the generation of crystal abnormality is suppressed when the upper layer piezoelectric film 52 is crystallized, and deterioration of the dielectric loss tangent tan δ can be reduced.

Fourth Modification of the Second Embodiment

In the second embodiment described above, an example in which the dimensions of the lower layer piezoelectric film 51 and the upper layer piezoelectric film 52 in the stacking direction D1 are substantially equal to each other has been described. However, the present disclosure is not limited thereto. For example, the lower layer piezoelectric film 51 and the upper layer piezoelectric film 52 may have respectively different dimensions in the stacking direction D1. That is, the dimension of the lower layer piezoelectric film 51 in the stacking direction D1 may be smaller or larger than the dimension in the stacking direction D1 of the upper layer piezoelectric film 52.

Third Embodiment

Next, a third embodiment is described with reference to FIG. 8. The present embodiment is different from the second embodiment in that the concentrations of scandium in the lower layer piezoelectric film 51 and the upper layer piezoelectric film 52 are different from each other. Other than the above, the configuration is the same as the second embodiment. Therefore, in the present embodiment, the parts different from the second embodiment are mainly described, and the same parts as those in the second embodiment may be omitted from description.

In the piezoelectric film 50 of the present embodiment, the lower layer piezoelectric film 51 and the upper layer piezoelectric film 52 are made of scandium aluminum nitride containing scandium. Further, the lower layer piezoelectric film 51 and the upper layer piezoelectric film 52 are configured to have respectively different scandium concentrations. Specifically, in the piezoelectric film 50 of the present embodiment shown in FIG. 8, the amount of scandium per unit mass of the lower layer piezoelectric film 51 is smaller than the amount of scandium per unit mass of the upper layer piezoelectric film 52. That is, the lower layer piezoelectric film 51 has a lower scandium concentration than the upper layer piezoelectric film 52. For example, the concentration of scandium in the lower layer piezoelectric film 51 of the present embodiment is lower than that of scandium in the lower layer piezoelectric film 51 and the upper layer piezoelectric film 52 of the second embodiment.

Figure 8:
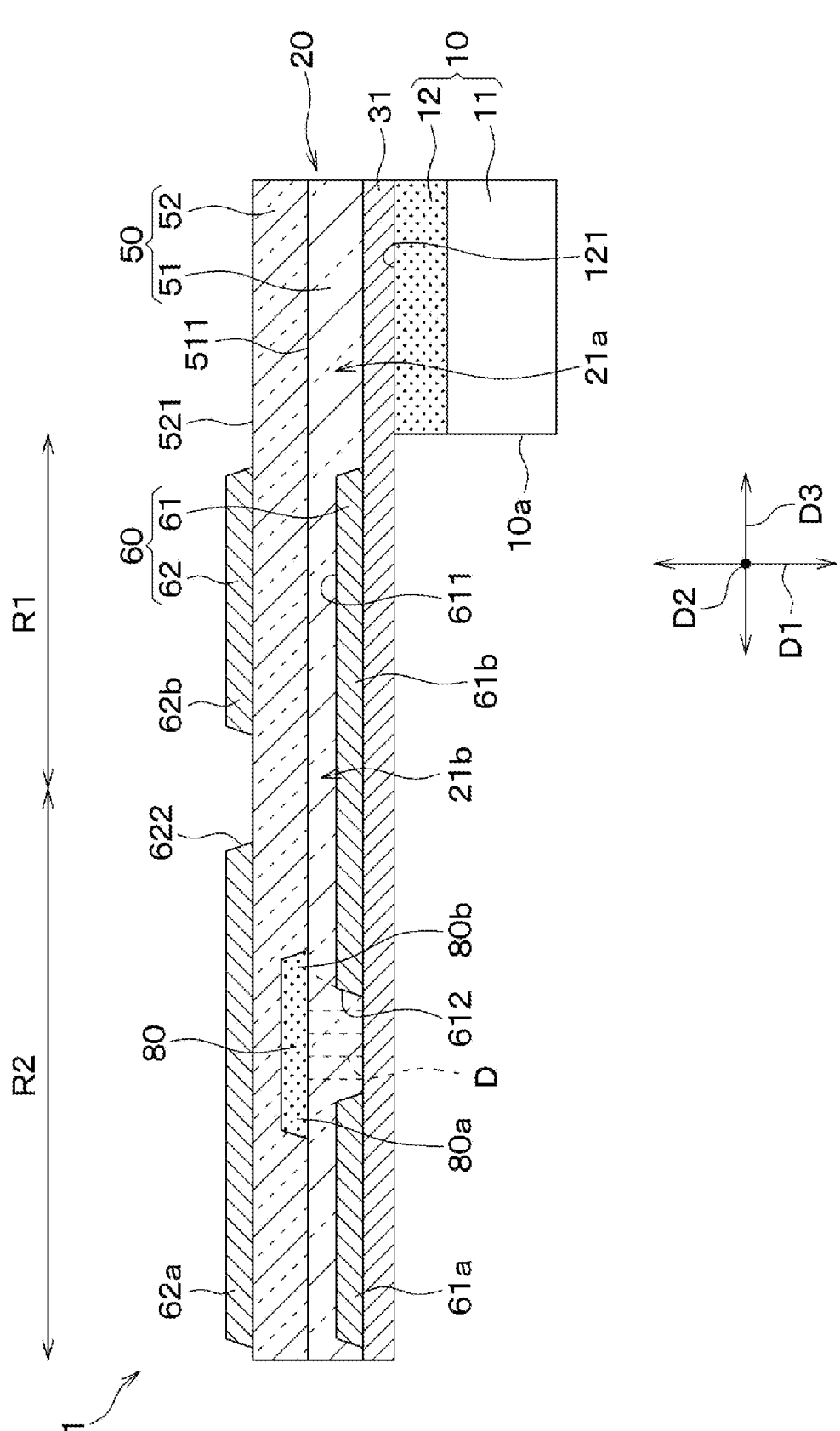
FIG. 8 is a diagram of a piezoelectric device corresponding to FIG. 1 according to a third embodiment.

In FIG. 8, the difference in scandium concentration is represented by using different hatching pitch. The lower layer piezoelectric film 51, which has a larger hatching pitch than that of the upper layer piezoelectric film 52, has a smaller scandium concentration than the upper layer piezoelectric film 52.

As described in the first embodiment, the piezoelectric device 1 may have higher, or improved sound pressure detection sensitivity of the piezoelectric device 1 as the mass of scandium contained in the unit mass of the piezoelectric film 50 increases. However, in the piezoelectric device 1, the larger the amount of scandium per unit mass of the piezoelectric film 50, the more likely it is for the piezoelectric film 50 to have the abnormal crystalline portion D generated in the portion extending across the lower layer first slit 612.

In the piezoelectric device 1 of the present embodiment, the amount of scandium per unit mass of the lower layer piezoelectric film 51 extending across the lower layer first slit 612 is made to be smaller than the amount of scandium per unit mass of the upper layer piezoelectric film 52. Therefore, the generation of the abnormal crystalline portion D in the portion of the lower layer piezoelectric film 51 formed to extend across the lower layer first slit 612 can be reduced. Therefore, the deterioration of the dielectric loss tangent tan δ caused by the abnormal crystalline portion D generated in the lower layer piezoelectric film 51 can be reduced in the present embodiment, as compared with the configuration in which the amount of scandium per unit mass of the lower layer piezoelectric film 51 is greater than the amount of scandium per unit mass of the upper layer piezoelectric film 52.

Modification of Third Embodiment

In the third embodiment described above, an example in which the amount of scandium per unit mass of the lower layer piezoelectric film 51 is smaller than the amount of scandium per unit mass of the upper layer piezoelectric film 52 has been described. However, the present disclosure is limited thereto. The amount of scandium per unit mass of the lower layer piezoelectric film 51 may be greater than the amount of scandium per unit mass of the upper layer piezoelectric film 52, because the insulating film 80 is provided as described in the above embodiments.

Fourth Embodiment

Next, a fourth embodiment is described with reference to FIG. 9. In the present embodiment, the structure of a piezoelectric film 50 is different from that of the second embodiment and the third embodiment. Other than the above, the configuration is the same as the second embodiment or the third embodiment. Therefore, in the present embodiment, the parts different from the second embodiment and the third embodiment are mainly described, and the same parts as those in the second embodiment and the third embodiment may be omitted from the description.

The piezoelectric film 50 of the present embodiment has, in addition to the lower layer piezoelectric film 51 and the upper layer piezoelectric film 52, an intermediate piezoelectric film 53 provided at a position between the lower layer piezoelectric film 51 and the upper layer piezoelectric film 52. That is, the piezoelectric film 50 is formed by arranging the lower layer piezoelectric film 51, the intermediate piezoelectric film 53, and the upper layer piezoelectric film 52 in the stacking direction D1 in this order. Thus, the vibrating portion 20 is in a state in which the lower layer piezoelectric film 51, the intermediate piezoelectric film 53, and the upper layer piezoelectric film 52 are sandwiched between the lower layer electrode film 61 and the upper layer electrode film 62.

The thickness dimension of the intermediate piezoelectric film 53 in the stacking direction D1 is smaller than the thickness dimension of the lower layer piezoelectric film 51 and the dimension of the upper layer piezoelectric film 52 in the stacking direction D1. Further, the lower layer piezoelectric film 51 and the upper layer piezoelectric film 52 have substantially the same dimensions in the stacking direction D1. Then, the total of the thickness dimensions of the lower layer piezoelectric film 51, the intermediate piezoelectric film 53, and the upper layer piezoelectric film 52 in the stacking direction D1 is the thickness dimension of the piezoelectric film 50 in the stacking direction D1 of the first embodiment.

The lower layer piezoelectric film 51 has a lower layer piezoelectric film surface 511 on one side opposite to the lower layer electrode surface 611. The intermediate piezoelectric film 53 has an intermediate piezoelectric film surface 531 on one side opposite to the lower layer piezoelectric film surface 511. The upper layer piezoelectric film 52 has an upper layer piezoelectric film surface 521 on one side opposite to the intermediate piezoelectric film surface 531. The lower layer piezoelectric film 51 of the present embodiment corresponds to a first piezoelectric film, the lower layer piezoelectric film surface 511 corresponds to a first piezoelectric film surface, and the intermediate piezoelectric film 53 corresponds to a second piezoelectric film, and the intermediate piezoelectric film surface 531 corresponds to a second piezoelectric film surface, and the upper layer piezoelectric film 52 corresponds to a third piezoelectric film, for example.

The insulating film 80 of the present embodiment is provided at a position between the lower layer electrode film 61 and the upper layer electrode film 62 to overlap with the lower layer first slit 612 in the stacking direction D1. Specifically, the insulating film 80 is formed in a substantially planar, thin film shape on the lower layer piezoelectric film surface 511 at a position away from the lower layer electrode surface 611.

Figure 9:
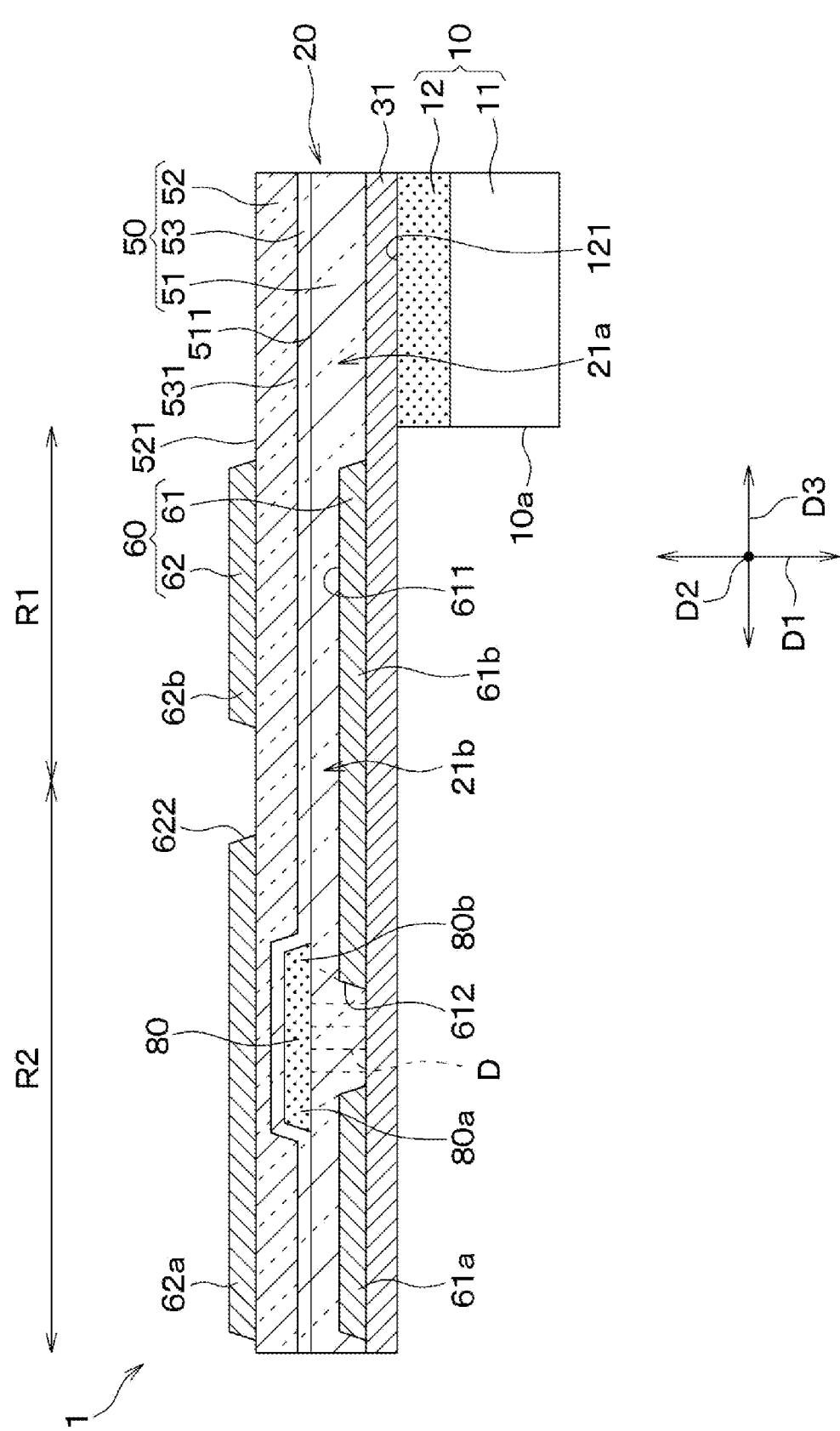
FIG. 9 is a diagram of a piezoelectric device corresponding to FIG. 1 according to a fourth embodiment.

Further, as shown in FIG. 9, the insulating film 80 overlaps entirely with the lower layer first slit 612 in the stacking direction D1, in the cross section along the stacking direction D1, and extends across the lower layer first slit 612.

Further, the lower layer piezoelectric film 51, the intermediate piezoelectric film 53, and the upper layer piezoelectric film 52 are made of scandium aluminum nitride as in the second embodiment. The lower layer piezoelectric film 51 and the intermediate piezoelectric film 53 are configured to have different scandium concentrations as compared with the upper layer piezoelectric film 52. Specifically, the amount of scandium per unit mass of the lower layer piezoelectric film 51 and the intermediate piezoelectric film 53 is smaller than the amount of scandium per unit mass of the upper layer piezoelectric film 52.

That is, the lower layer piezoelectric film 51 and the intermediate piezoelectric film 53 have a lower scandium concentration than the upper layer piezoelectric film 52. Further, the lower layer piezoelectric film 51 and the intermediate piezoelectric film 53 have substantially the same mass of scandium per unit mass with each other. That is, the concentrations of scandium in the lower layer piezoelectric film 51 and the intermediate piezoelectric film 53 are substantially equal to each other.

The upper layer piezoelectric film 52 is provided on the intermediate piezoelectric film surface 531 to extend across the insulating film 80. Further, the upper layer electrode film 62 is formed on the upper layer piezoelectric film surface 521.

As described above, in the piezoelectric device 1 of the present embodiment, the insulating film 80 is provided on the lower layer piezoelectric film surface 511, and overlaps entirely with the lower layer first slit 612 in the stacking direction D1 in the cross section along the stacking direction D1 and passing through the lower layer first slit 612.

According to the above, the insulating film 80 can be made closer to the lower layer first slit 612 as compared with the configuration of forming the insulating film 80 on the intermediate piezoelectric film surface 531 or on the upper layer piezoelectric film surface 521. Therefore, when the insulating film 80 is formed to overlap the entire lower layer first slit 612 in the stacking direction D1, the size of the cross-sectional area of the insulating film 80 orthogonal to the stacking direction D1 can be reduced as compared with the configuration in which the insulating film 80 is formed on the intermediate piezoelectric film surface 531 or on the upper layer piezoelectric film surface 521.

Therefore, it is possible to increase a portion where the insulating film 80 is not sandwiched between the lower layer electrode film 61 and the upper layer electrode film 62, within the entire range where the lower layer electrode film 61 and the upper layer electrode film 62 face each other. That is, the effective range of the electrodes of the lower layer electrode film 61 and the upper layer electrode film 62 is expandable. Therefore, it is possible to secure the capacitance between the lower layer electrode film 61 and the upper layer electrode film 62 while reducing the deterioration of the dielectric loss tangent tan δ caused by the abnormal crystalline portion D of the piezoelectric film 50.

Further, according to the embodiment described above, the following advantageous effects are achievable.

(1) In the above embodiment, the lower layer piezoelectric film 51, the intermediate piezoelectric film 53, and the upper layer piezoelectric film 52 are configured to include scandium. The amount of scandium per unit mass of the lower layer piezoelectric film 51 is smaller than the amount of scandium per unit mass of one of the intermediate piezoelectric film 53 and the upper layer piezoelectric film 52.

According to the above, the crystalline abnormality portion D in the upper layer piezoelectric film 52 is less likely to occur, as compared with the configuration in which the amount of scandium per unit mass of the lower layer piezoelectric film 51 is greater than the amount of scandium per unit mass of the upper layer piezoelectric film 52. Therefore, deterioration of the dielectric loss tangent tan δ of the piezoelectric device 1 can be reduced.

Further, in the present embodiment, the amount of scandium per unit mass of the intermediate piezoelectric film 53 is also smaller than the amount of scandium per unit mass of the upper layer piezoelectric film 52. Therefore, as compared with the configuration in which the amount of scandium per unit mass of the intermediate piezoelectric film 53 is greater than the amount of scandium per unit mass of the upper layer piezoelectric film 52, the generation of the abnormal crystalline portion D can be reduced when the intermediate piezoelectric film 53 crystallizes. Therefore, the crystallinity of the upper layer electrode film 62 formed on the intermediate piezoelectric film surface 531 is improvable.

First Modification of the Fourth Embodiment

Figure 10:
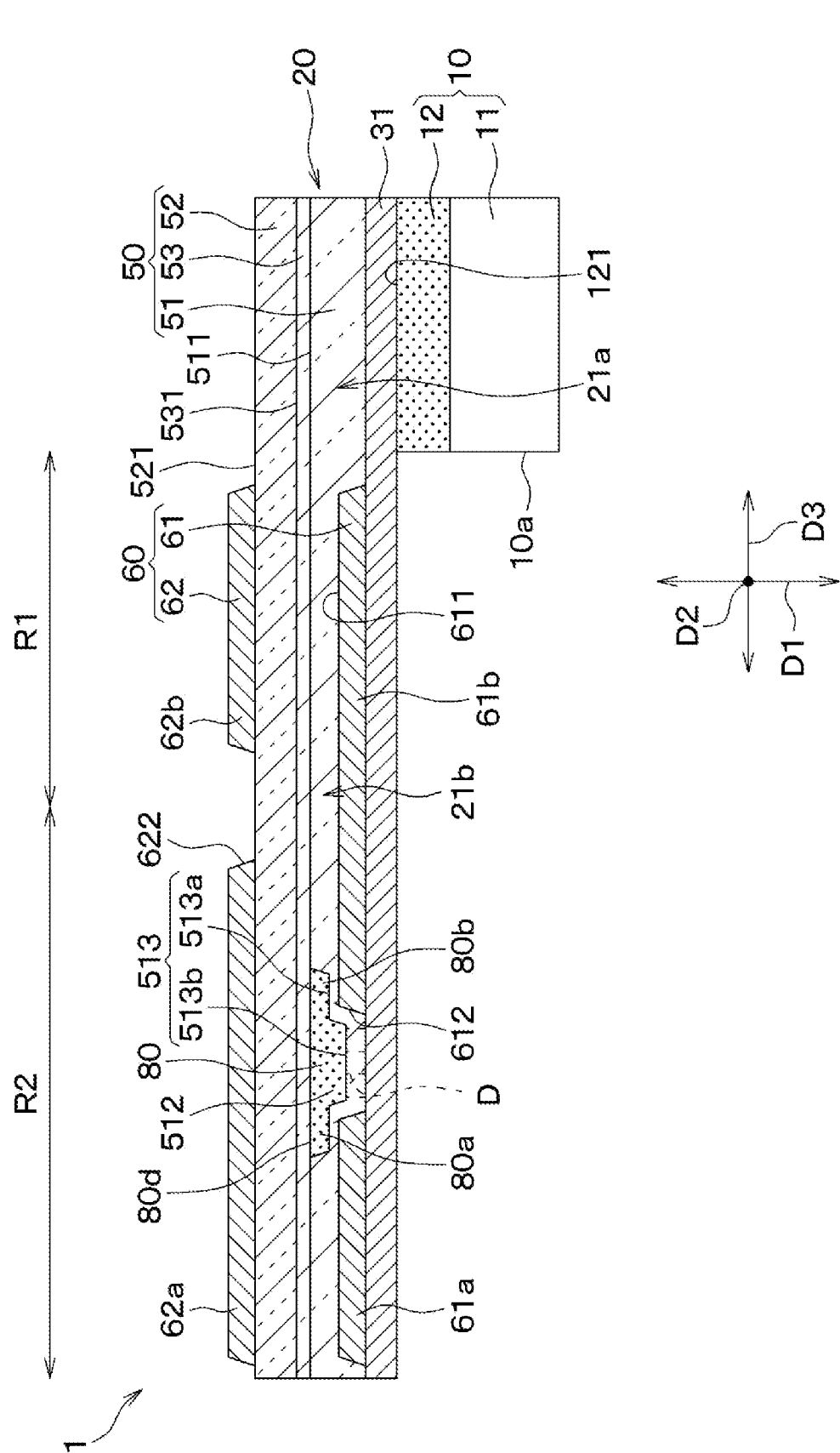
FIG. 10 is a diagram of a piezoelectric device corresponding to FIG. 1 according to a first modification of the fourth embodiment.

In the above-mentioned fourth embodiment, an example in which the insulating film 80 is formed on the planar, lower layer piezoelectric film surface 511 has been described. However, the present disclosure is not limited thereto. For example, as shown in FIG. 10, the lower layer piezoelectric film 51 may have a structure in which the lower layer piezoelectric film surface 511 has the piezoelectric film recess 513 defining the piezoelectric film space 512 recessed to the lower layer electrode surface 611. Specifically, the piezoelectric film recess 513 has a large recess 513a in which the size of the recess in the slit width direction D3 is greater than the lower layer first slit 612, and a small recess 513b in which the size of the recess in the slit width direction D3 is smaller than the lower layer first slit 612. That is, the large recess 513a is configured to have a greater size in the slit width direction D3 than that of the small recess 513b.

The large recess 513a and the small recess 513b are formed continuously and adjacently in the stacking direction D1 in this order, and are recessed from the lower layer piezoelectric film surface 511 to the lower layer electrode film 61. The large recess 513a is provided to have a portion that does not overlap with the lower layer first slit 612 in the stacking direction D1. Further, the small recess 513b entirely overlaps with the lower layer first slit 612 in the stacking direction D1.

Further, the insulating film 80 is provided in the piezoelectric film space 512. In the insulating film 80, a part of the portion provided in the large recess 513a overlaps with the lower layer first slit 612 in the stacking direction D1. Further, a portion of the insulating film 80 provided in the small recess 513b entirely overlaps with the lower layer first slit 612 in the stacking direction D1. Further, in the insulating film 80, an insulating surface 80d formed on one side opposite to the piezoelectric film recess 513 has a planar shape, which is orthogonal to the stacking direction D1. Then, the insulating surface 80d is formed as a plane surface that is continuous with the lower layer piezoelectric film surface 511a but is different from the piezoelectric film recess 513. The insulating surface 80d is formed by using the CMP method, the etch back method, or the like.

According to the above, the insulating surface 80d on which the intermediate piezoelectric film 53 is formed and the lower layer piezoelectric film surface 511 other than the portion of the piezoelectric film recess 513 are made as a continuous planar shape. That is, the lower layer piezoelectric film surface 511 and the insulating surface 80d, which are the interfaces of crystal growth of the intermediate piezoelectric film 53, are made as one continuous plane. Therefore, the generation of crystal abnormality is suppressed when the intermediate piezoelectric film 53 is crystallized, and the crystallinity of the upper layer electrode film 62 is improved, thereby reducing the deterioration of the dielectric loss tangent tan δ.

Second Modification of the Fourth Embodiment

In the above-mentioned fourth embodiment, the amount of scandium per unit mass of the lower layer piezoelectric film 51 and the intermediate piezoelectric film 53 is smaller than the amount of scandium per unit mass of the upper layer piezoelectric film 52. Further, although the example in which the masses of scandium contained in the lower layer piezoelectric film 51 and the intermediate piezoelectric film 53 are substantially equal to each other per unit mass has been described, the present disclosure is not limited thereto.

That is, as long as the amount of scandium per unit mass of the lower layer piezoelectric film 51 is smaller than the amount of scandium per unit mass of one of the intermediate piezoelectric film 53 and the upper layer piezoelectric film 52, the above-described configuration of the fourth embodiment is modifiable. The amount of scandium per unit mass of each of the lower layer piezoelectric film 51, the intermediate piezoelectric film 53, and the upper layer piezoelectric film 52 may be appropriately set in accordance with the use of the piezoelectric device 1 and the like.

For example, the concentrations of scandium in the intermediate piezoelectric film 53 and the upper layer piezoelectric film 52 may be substantially equal to each other. Alternatively, the lower layer piezoelectric film 51, the intermediate piezoelectric film 53, and the upper layer piezoelectric film 52 may respectively be configured to have the amount of scandium per unit mass increased in an ascending order, i.e., the lower layer piezoelectric film 51 may have the smallest, the intermediate piezoelectric film 53 may have an intermediate, and the upper layer piezoelectric film 52 may have the greatest amount of per unit mass scandium.

Fifth Embodiment

Next, a fifth embodiment is described with reference to FIG. 11. The present embodiment is different from the first embodiment in that the insulating film 80 is replaced with a void 81 (i.e., space). The configuration of the present embodiment is the same as the first embodiment other than the above. Therefore, in the present embodiment, the parts different from the first embodiment are mainly described, and description of the same parts as the first embodiment may be omitted.

Figure 11:
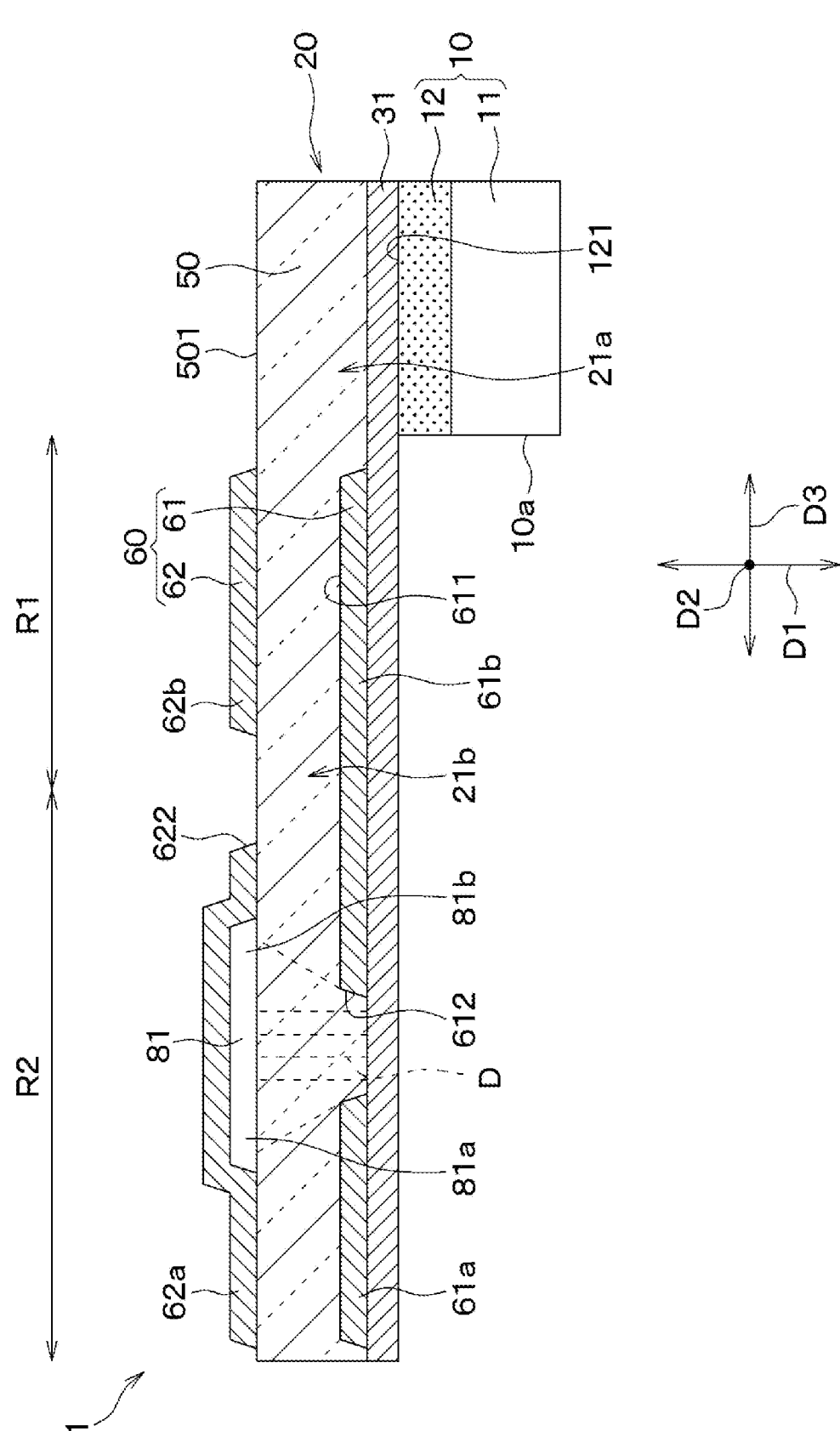
FIG. 11 is a diagram of a piezoelectric device corresponding to FIG. 1 according to a fifth embodiment.

In the present embodiment, as shown in FIG. 11, the void 81 is formed, or defined, by being covered with the upper layer electrode film 62 formed on the piezoelectric film surface 501 of the piezoelectric film 50. That is, in the piezoelectric device 1 of the present embodiment, a gap is formed between the piezoelectric film 50 and the upper layer electrode film 62. Then, an air existing in the void 81 functions as an insulating material. In the present embodiment, the void 81 corresponds to an insulating portion.

The void 81 has a first void 81a that does not overlap with the lower layer first slit 612 in the stacking direction D1 on one side of the slit width direction D3 in the cross section shown in FIG. 11. Further, the void 81 has a second void 81b that does not overlap with the lower layer first slit 612 in the stacking direction D1 on the other side of the slit width direction D3 in the cross section shown in FIG. 11. The size of the first gap portion 81a or the second void 81b in the slit width direction D3 is set to be four times or more of the dimension of the piezoelectric film 50 in the stacking direction D1.

The void 81 is formed on the piezoelectric film surface 501 by, for example, (i) forming a sacrificial layer on the piezoelectric film 50, (ii) forming an upper layer electrode film 62 on the sacrificial layer, and then (iii) removing the sacrificial layer by etching.

According to the above, the electric resistance value between the lower layer electrode film 61 and the upper layer electrode film 62 can be increased by the void 81. Therefore, even when the abnormal crystalline portion D is generated in the portion of the piezoelectric film 50 formed across the lower layer first slit 612, deterioration of the dielectric loss tangent tan δ of the piezoelectric film 50 can be reduced. Therefore, the sound pressure detection sensitivity of the piezoelectric device 1 is improvable as compared with a case where the void 81 is not provided.

Modification of the Fifth Embodiment

Figure 12:
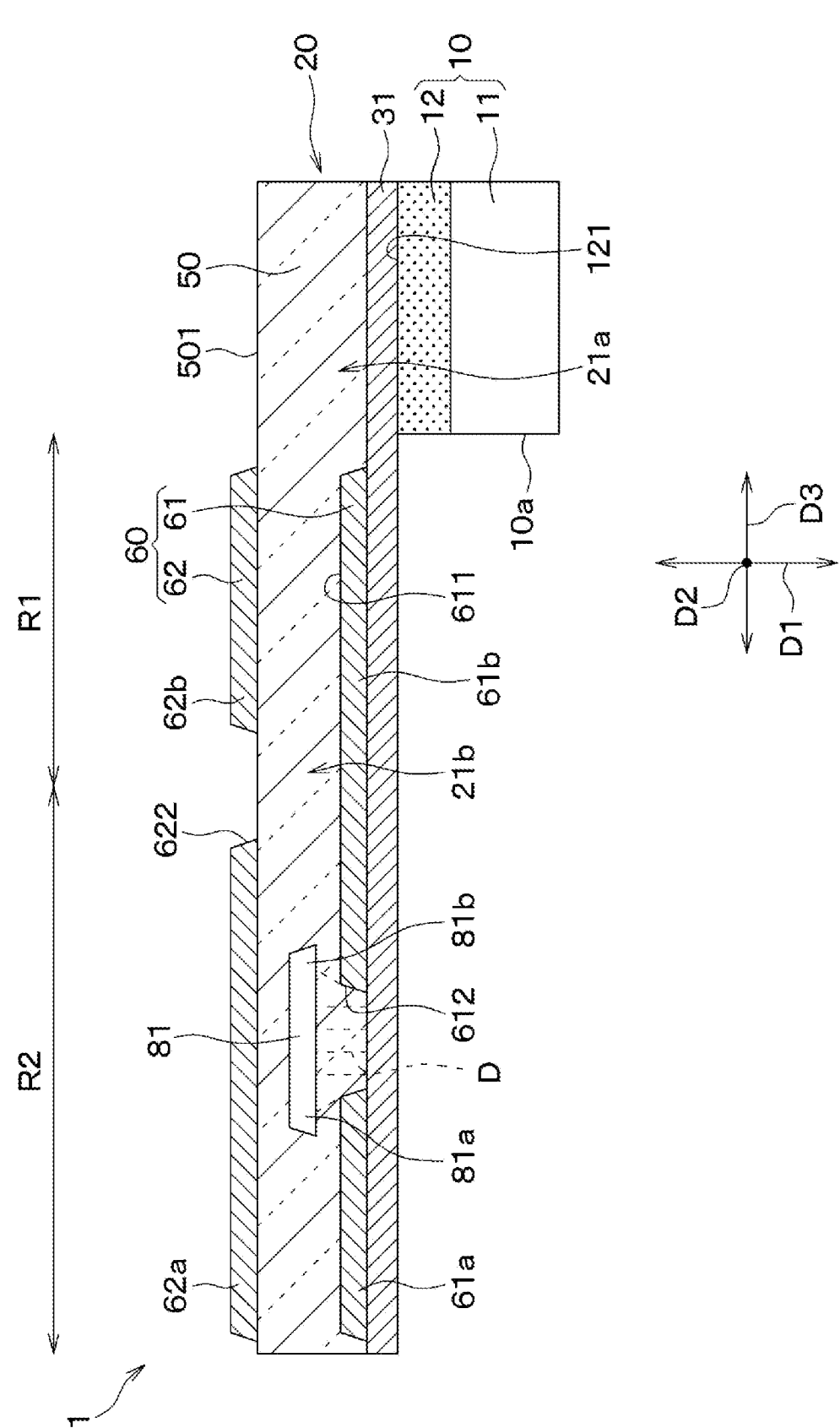
FIG. 12 is a diagram of a piezoelectric device corresponding to FIG. 1 according to a modified example of the fifth embodiment.

In the fifth embodiment described above, an example in which the void 81 is formed as the insulating film 80 on the piezoelectric film surface 501 has been described. However, the present disclosure is not limited thereto. For example, as shown in FIG. 12, the void 81 may be provided inside the piezoelectric film 50. In such case, the insulating film 80 can be formed by removing a part of the piezoelectric film 50 by an etching method using an etching hole (not shown) formed in the piezoelectric film 50 to form the insulating film 80.

OTHER EMBODIMENTS

Although representative embodiments of the present disclosure have been described above, the present disclosure is not limited to the embodiments described above, and various modifications can also be made, for example, as follows.

Figure 13:
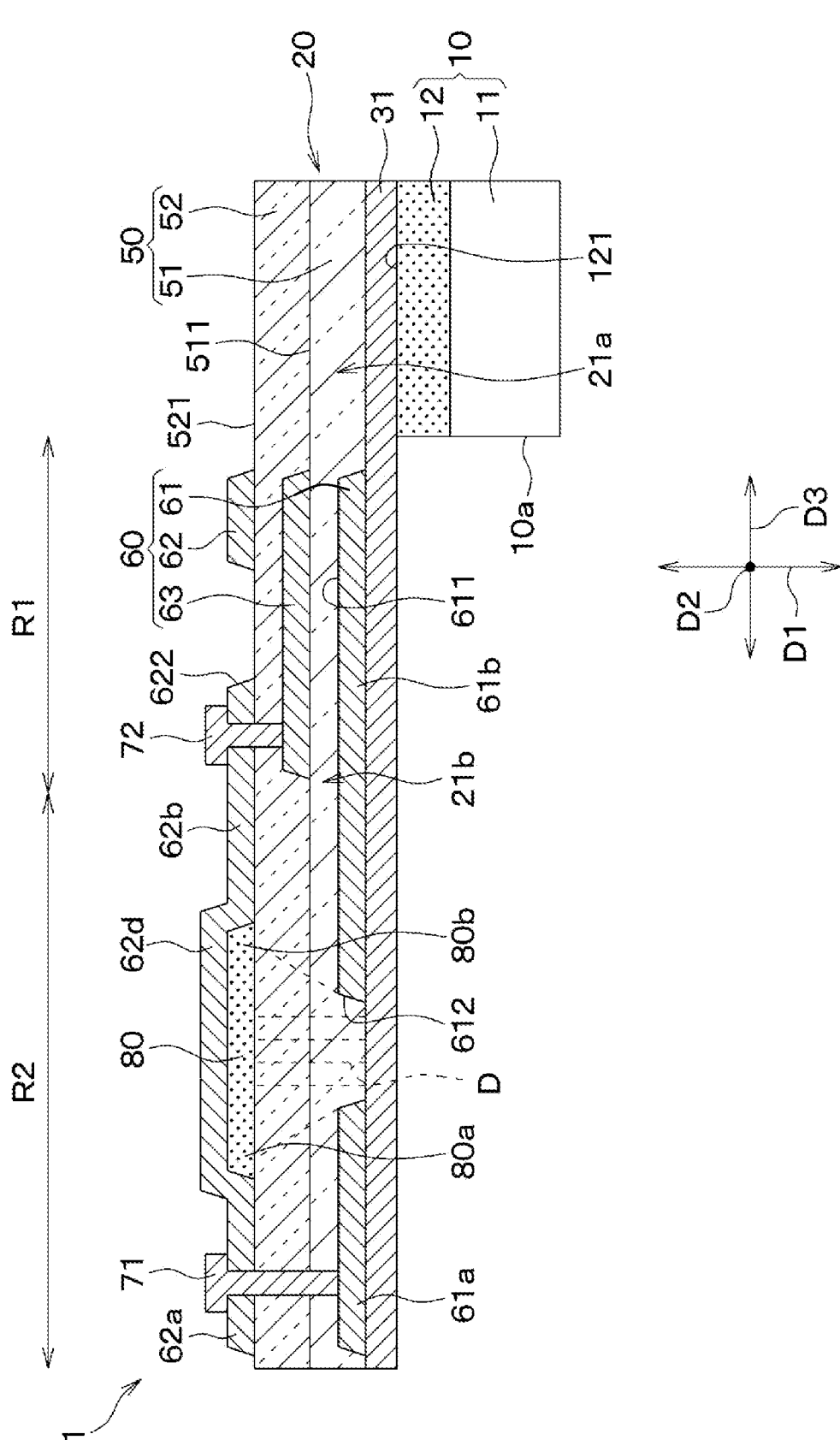
FIG. 13 is a diagram of a piezoelectric device corresponding to FIG. 1 according to another embodiment.

In the second and third embodiments described above, an example is shown in which the electrode portion 60 has the lower layer electrode film 61 arranged on the support surface 121 via the seed layer 31 and the upper layer electrode film 62 arranged on the upper layer piezoelectric film surface 521. However, the present disclosure is not limited thereto. For example, as shown in FIG. 13, the electrode portion 60 may be configured to have a lower layer electrode film 61 arranged on the support surface 121 via the seed layer 31, an intermediate electrode film 63 arranged on the lower layer piezoelectric film surface 511, and the upper layer electrode film 62 arranged on the upper layer piezoelectric film surface 521. That is, the vibrating portion 20 may have a configuration in which the lower layer piezoelectric film 51 is sandwiched by the lower layer electrode film 61 and the intermediate electrode film 63, and the upper layer piezoelectric film 52 is sandwiched by the intermediate electrode film 63 and the upper layer electrode film 62.

When the electrode portion 60 is configured in such manner, the electrode portion 60 has a first electrode portion 71 that electrically connects the lower layer electrode film 61 and the upper layer electrode film 62, and a second electrode portion 72 that electrically connects the intermediate electrode film 63 and the upper layer electrode film 62. The upper layer electrode film 62 has an electric wiring layer 62d for electrically connecting (i) the upper layer electrode film 62 provided with the first electrode portion 71 and (ii) the upper layer electrode film 62 provided with the second electrode portion 72. In the piezoelectric device 1 configured as described above, the insulating film 80 may be configured to be provided at a position between (i) the portion of the upper layer electrode film 62 where the electric wiring layer 62d is provided and (ii) the lower layer electrode film 61, to overlap with the lower layer first slit 612 in the stacking direction D1.

Specifically, the insulating film 80 may be formed on the upper layer piezoelectric film surface 521 as shown in FIG. 13, as long as it overlaps with the lower layer first slit 612 in the stacking direction D1. Further, although not shown in the drawing, the insulating film 80 may be formed on the lower layer piezoelectric film surface 511, as long as it overlaps with the lower layer first slit 612 in the stacking direction D1.

In the above-described embodiments, an example in which the insulating film 80 overlaps with the entire lower layer first slit 612 in the stacking direction D1 in the cross section of the insulating film 80 cutting in the stacking direction D1 has been described. However, the present disclosure is not limited thereto. The insulating film 80 may be configured to overlap with a part of the lower layer first slit 612 in the stacking direction D1 in the cross section of cutting in the stacking direction D1.

In the above-described embodiment, an example in which the piezoelectric film 50 is configured to include scandium has been described. However, the present disclosure is not limited thereto. For example, the piezoelectric film 50 may have a configuration that does not contain scandium.

In the above-described embodiments, the first expansion portion 80a that does not overlap with the lower layer first slit 612 in the stacking direction D1 on one side of the slit width direction D3 orthogonal to the stacking direction D1 in the cross section of the insulating film 80 cutting in the stacking direction D1. Further, the insulating film 80 has the second expansion portion 80b on the other side of the slit width direction D3, which does not overlap with the lower layer first slit 612 in the stacking direction D1. Then, the first expansion portion 80a and the second expansion portion 80b are provided in the insulating film 80 as an example in which the size of each of the first expansion portion 80a and the second expansion portion 80b in the slit width direction D3 is four times or more of the thickness dimension of the piezoelectric film 50 in the stacking direction D1. However, the present disclosure is not limited thereto.

For example, the insulating film 80 may have a configuration that does not have the first expansion portion 80a and the second expansion portion 80b. That is, the insulating film 80 may have a configuration in which the size thereof in the slit width direction D3 is smaller than the size of the lower layer first slit 612 in the slit width direction D3.

Further, the insulating film 80 may have a configuration in which the size of each of the first expansion portion 80a and the second expansion portion 80b in the slit width direction D3 is smaller than four times of the thickness dimension of the piezoelectric film 50 in the stacking direction D1.

In the above-described embodiments, an example in which the insulating film 80 is formed at a position corresponding to the portion where the lower layer first slit 612 is formed has been described. However, the present disclosure is not limited thereto. For example, the insulating film 80 may be configured to have a size that overlaps with the lower layer electrode film 61 and the upper layer electrode film 62 in the stacking direction D1.

In the above-described embodiment, an example in which the piezoelectric device 1 detects a pressure detection signal according to the sound pressure has been described. However, the present disclosure is not limited thereto. For example, the piezoelectric device 1 may be configured to transmit ultrasonic waves and receive reflected waves as a reflection of the transmitted ultrasonic waves.

In the embodiments described above, it is needless to say that the elements configuring the embodiments are not necessarily essential except in case where those elements are clearly indicated as essential in particular, and except in case where those elements are considered to be obviously essential in principle, and the like.

In the embodiments described above, the present disclosure is not specifically limited to the numbers, numerical values, quantities, ranges, and the like regarding the components mentioned in the embodiments, except when the numbers, numerical values, quantities, ranges, and the like are indicated as expressly indispensable, and except when it is obviously limited to the specific number in principle, and the like.

In the embodiments described above, when referring to the shape, positional relationship, and the like of a component and the like, it is not limited to such shape, positional relationship, and the like, except for the case where it is specifically specified, and except for the case where it is fundamentally limited to a specific shape, positional relationship, and the like.

What is claimed is:

1. A piezoelectric device comprising:
a support member having a support surface; and
a vibrating portion stacked on the support surface in a stacking direction, wherein
the vibrating portion includes
a first electrode, a piezoelectric film and a second electrode that are arranged adjacently in the stacking direction, and an insulating portion configured to increase an electric resistance value between the first electrode and the second electrode,
the first electrode is arranged on the support surface, and is provided with (i) an opening penetrating through the first electrode in the stacking direction, and (ii) a first electrode surface that is a surface opposite to the support surface,
the piezoelectric film is provided to extend across the opening on the first electrode surface, and is provided with a piezoelectric film surface that is a surface opposite to the first electrode surface,
the second electrode is provided on the piezoelectric film surface, and
the insulating portion is provided at a position between the first electrode and the second electrode, and at least a part of the insulating portion overlaps with the opening of the first electrode in the stacking direction.

2. The piezoelectric device of claim 1, wherein
the insulating portion is provided on the piezoelectric film surface, and
the second electrode is provided on the piezoelectric film surface and extends across the insulating portion.

3. The piezoelectric device of claim 1, wherein
the piezoelectric film includes a first piezoelectric film and a second piezoelectric film arranged adjacently in the stacking direction,
the first piezoelectric film is provided on the first electrode surface, and has a first piezoelectric film surface that is a surface opposite to the first electrode surface,
the insulating portion is provided on the first piezoelectric film surface, and overlaps with an entire area of the opening in the stacking direction in a cross section taken along the opening in the stacking direction, and
the second piezoelectric film is provided on the first piezoelectric film surface and extends across the insulating portion.

4. The piezoelectric device of claim 3, wherein
the first piezoelectric film and the second piezoelectric film are made of materials including scandium, and
an amount of scandium per unit mass of the first piezoelectric film is smaller than an amount of scandium per unit mass of the second piezoelectric film.

5. The piezoelectric device of claim 1, wherein
the piezoelectric film includes a first piezoelectric film, a second piezoelectric film and a third piezoelectric film arranged adjacently in the stacking direction,
the first piezoelectric film is provided on the first electrode surface, and has a first piezoelectric film surface that is a surface opposite to the first electrode surface,
the insulating portion is provided on the first piezoelectric film surface, and overlaps with an entire area of the opening in the stacking direction in a cross section taken along the opening in the stacking direction, the second piezoelectric film is provided on the first piezoelectric film surface to extend across the insulating portion, and includes a second piezoelectric film surface that is a surface opposite to the first piezoelectric film surface, and the third piezoelectric film is provided on the second piezoelectric film surface.

6. The piezoelectric device of claim 5, wherein the first piezoelectric film, the second piezoelectric film and the third piezoelectric film are respectively made of materials including scandium, and an amount of scandium per unit mass of the first piezoelectric film is smaller than at least one of an amount of scandium per unit mass of the second piezoelectric film and an amount of scandium per unit mass of the third piezoelectric film.

7. The piezoelectric device of claim 3, wherein the first piezoelectric film is provided with a piezoelectric film recess defining a piezoelectric film space, and the piezoelectric film recess is recessed from the first piezoelectric film surface toward the first electrode surface, and the insulating portion is provided in the piezoelectric film space to have an insulating surface that is positioned on a side opposite to the piezoelectric film recess, the insulating surface of the insulating portion is a continuous plane as the first piezoelectric film surface.

8. The piezoelectric device of claim 3, wherein the insulating portion includes:

a first expansion portion that does not overlap with the opening in the stacking direction, the first expansion portion being positioned on one side in a width direction that is orthogonal to the stacking direction in the cross section; and a second expansion portion that does not overlap with the opening in the stacking direction, the second expansion portion being positioned on another side in the width direction, and a size of the first expansion portion or the second expansion portion in the width direction is equal to or greater than at least four times of a dimension of the piezoelectric film in the stacking direction.

9. The piezoelectric device of claim 3, wherein the second piezoelectric film has a crystal structure, and the insulating portion includes a material that causes the crystal structure of the second piezoelectric film to have self-align characteristics.

10. The piezoelectric device of claim 1, wherein the insulating portion is made of a material different from the support member, and is provided at a position corresponding to a portion where the opening is provided.

11. The piezoelectric device of claim 1, wherein the insulating portion includes an amorphous film having an amorphous structure.

12. The piezoelectric device of claim 1, wherein the insulating portion includes a void.

13. A piezoelectric device comprising:

a support member having a support surface; and a vibrating portion stacked on the support surface in a stacking direction, wherein the vibrating portion includes a first electrode arranged on the support surface of the support member, and provided with an opening penetrating through the first electrode in the stacking direction, a piezoelectric film filled in the opening and arranged on a surface of the first electrode in the stacking direction to extend across the opening of the first electrode, a second electrode arranged on the piezoelectric film in the stacking direction, and an insulating portion disposed at a position between the first electrode and the second electrode, and configured to increase an electric resistance value between the first electrode and the second electrode, and at least a part of the insulating portion overlaps with the opening of the first electrode in the stacking direction.

14. The piezoelectric device of claim 13, wherein the insulating portion overlaps with an entire area of the opening of the first electrode in the stacking direction.

15. The piezoelectric device of claim 13, wherein the piezoelectric film includes a first piezoelectric film and a second piezoelectric film arranged adjacently in the stacking direction, the first piezoelectric film is arranged on the first electrode and filled in the opening, the insulating portion is provided in the first piezoelectric film to have a same plan surface with a surface of the first piezoelectric film, the insulating portion overlaps with an entire area of the opening in the stacking direction in a cross section taken along the opening in the stacking direction, and the second piezoelectric film is provided on the first piezoelectric film surface and extends across the insulating portion.

* * * * *